(12) United States Patent
Kubo

(10) Patent No.: US 9,685,505 B2
(45) Date of Patent: Jun. 20, 2017

(54) SEMICONDUCTOR DEVICE WITH GUARD RINGS

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/958,690

(22) Filed: Dec. 3, 2015

(65) Prior Publication Data

US 2016/0163790 A1    Jun. 9, 2016

(30) Foreign Application Priority Data

Dec. 4, 2014  (JP) .................................. 2014-245900

(51) Int. Cl.
| | |
|---|---|
| *H01L 29/06* | (2006.01) |
| *H01L 29/78* | (2006.01) |
| *H01L 29/40* | (2006.01) |
| *H01L 29/10* | (2006.01) |
| *H01L 29/739* | (2006.01) |

(52) U.S. Cl.
CPC ...... *H01L 29/0634* (2013.01); *H01L 29/0619* (2013.01); *H01L 29/402* (2013.01); *H01L 29/78* (2013.01); *H01L 29/7811* (2013.01); *H01L 29/7813* (2013.01); *H01L 29/0638* (2013.01); *H01L 29/1095* (2013.01); *H01L 29/7397* (2013.01)

(58) Field of Classification Search
CPC . H01L 29/0634; H01L 29/78; H01L 29/7811; H01L 29/0619; H01L 29/404
See application file for complete search history.

(56) References Cited

U.S. PATENT DOCUMENTS

| | | | |
|---|---|---|---|
| 2004/0185637 A1* | 9/2004 | Fu | H01L 21/76229 438/401 |
| 2012/0098064 A1* | 4/2012 | Onishi | H01L 29/0619 257/341 |
| 2014/0197476 A1 | 7/2014 | Shimatou | |

FOREIGN PATENT DOCUMENTS

JP    2014-138090 A    7/2014

* cited by examiner

*Primary Examiner* — Tucker J Wright
(74) *Attorney, Agent, or Firm* — Chen Yoshimura LLP

(57) ABSTRACT

A semiconductor device that includes: a semiconductor layer of a first conductivity type, having a peripheral area and a cell area inside of the peripheral area; a region of a second conductivity type in the semiconductor layer in the cell area; and a plurality of guard rings of the second conductivity type in the semiconductor layer in the peripheral area, each having a substantially same depth as the region of the second conductivity type in the cell area. The plurality of guard rings include at least one first ring that has a diffusion region in the depth profile in the semiconductor layer that is wider at a top thereof.

17 Claims, 44 Drawing Sheets

| Ref | Deep Trench | | | | | | | | | | | | | | | | | | | | | | | | | | | | | | | BVDSS | Purpose |
|---|---|---|---|---|---|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 680V | |
| (1) | | | | B | B | B | B | | B | B | | B | B | | B | B | | B | B | | B | B | | B | B | | B | B | | B | B | 699V | Equal Arrangement of Electric Field (A-type every three rings) |
| (2) | | | B | B | | | B | B | | | B | B | | | B | B | | | B | B | | | B | B | | | B | B | | | B | 695V | Equal Arrangement of Electric Field (A-type every four rings) |
| (3) | | | B | B | B | | | B | B | B | | | B | B | B | | | B | B | B | | | B | B | B | | | B | B | B | | 532V | Equal Arrangement of Electric Field (A-type every five rings) |
| (4) | B | B | B | B | B | B | B | B | B | B | B | | B | B | B | B | B | B | B | B | | B | B | B | B | B | B | B | B | | B | 669V | Equal Arrangement of Electric Field (A-type every six rings) |

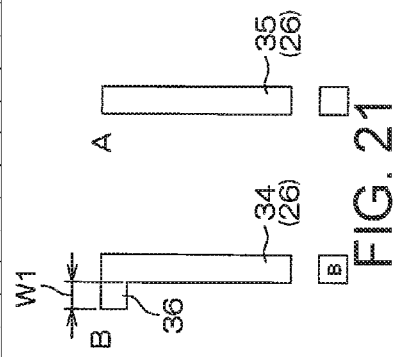

FIG. 21

| | Breakdown Voltage Value | Position of Depletion Layer End | Number of A-types inside Depletion Layer | Type of Column at Depletion Layer End | Greatest Electric Field Intensity |
|---|---|---|---|---|---|
| Ref | 680 | 12 | 12 | A | 300000 |
| (1) | 699 | 23 | 8 | A | 270000 |
| (2) | 695 | 25 | 7 | A | 350000 |
| (3) | 532 | 24 | 5 | A | 350000 |
| (4) | 669 | 28 | 5 | A | 350000 |

FIG. 27

| Specific Resistance (Ω·cm) | Impurity Concentration (cm⁻³) | Breakdown Voltage (V) | |
|---|---|---|---|
| | | Ref | Electric Field Reducing |
| 1.6 | 8.79×10¹⁵ | 422 | 423 |
| 1.7 | 8.24×10¹⁵ | 600 | 601 |
| 1.75 | 8.00×10¹⁵ | 680 | 699 |
| 1.8 | 7.76×10¹⁵ | 574 | 785 |
| 1.85 | 7.54×10¹⁵ | - | 740 |
| 1.9 | 7.33×10¹⁵ | - | 642 |

FIG. 30

SEMICONDUCTOR DEVICE WITH GUARD RINGS

BACKGROUND OF THE INVENTION

Technical Field

The present invention relates to a semiconductor device that includes guard rings.

Background Art

The semiconductor device disclosed in Patent Document 1, for example, is a well-known example of a semiconductor device that includes guard rings. The semiconductor device disclosed in Patent Document 1 includes: a semiconductor substrate that has an element active portion and an element periphery portion; a p-type base region formed in the surface of the element active portion; an n-type source region formed within the p-type base region; and p-type guard rings formed in the surface of the element periphery portion.

RELATED ART DOCUMENT

Patent Document

Patent Document 1: Japanese Patent Application Laid-Open Publication No. 2014-138090

SUMMARY OF THE INVENTION

In order to make the manufacturing process more efficient, guard rings are normally formed at the same time as an impurity region (a p-type base region in Patent Document 1) that has the same type of conductivity and that is located within a substrate. As a result, the properties of the guard rings, such as the impurity concentration, are limited by the properties of the impurity region located within a cell area. Therefore, it is difficult to control the spread of a depletion layer in a peripheral area even if there are guard rings, for example.

Accordingly, the present invention is directed to a semiconductor device that substantially obviates one or more of the problems due to limitations and disadvantages of the related art.

An object of the present invention is to provide a semiconductor device that can easily control the spread of the depletion layer in the peripheral area and that can increase breakdown voltage in the peripheral area.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor layer of a first conductivity type, having a peripheral area and a cell area inside of the peripheral area; a region of a second conductivity type in the semiconductor layer in the cell area; and a plurality of guard rings of the second conductivity type in the semiconductor layer in the peripheral area, each having a substantially same depth as the region of the second conductivity type in the cell area, wherein the plurality of guard rings include at least one first ring that has a diffusion region in a depth profile in the semiconductor layer that is wider at a top thereof.

In such a structure, it is possible to promote the spread of the depletion layer toward an end face of the semiconductor layer via the first ring. Therefore, it is possible to easily control the spread of the depletion layer by disposing first rings in the plurality of guard rings at suitable locations. In this way, it is possible to appropriately design the degree to which the depletion layer spreads toward the end face such that the breakdown voltage in the peripheral area is increased.

In an embodiment of the present invention, the region of the second conductivity type in the cell area includes a cell-side column in the depth profile in the semiconductor layer that forms a superjunction structure, wherein the guard rings are respectively formed of a periphery-side column in the depth profile in the semiconductor layer that has a substantially same depth as the cell-side column.

It is possible to increase the breakdown voltage in the peripheral area while also increasing the breakdown voltage in the cell area via the superjunction structure. As a result, it is possible to provide a reliable high withstand voltage element.

In an embodiment of the present invention, the cell-side column and the periphery-side columns respectively include: a trench that defines an outline of the column; and an embedded layer of the second conductivity type inside the trench.

In an embodiment of the present invention, the embedded layer of the second conductivity type includes: an outer layer formed along an inner surface of the trench, and an inner layer that is embedded inside the outer layer and that has a specific resistance that is lower than a specific resistance of the outer layer.

In an embodiment of the present invention, a width of the diffusion region at the top of the first ring is 0.2 to 0.6 times a distance between adjacent guard rings.

In an embodiment of the present invention, the plurality of guard rings have a second ring between adjacent first rings, the second ring having a uniform width in the depth profile and not having a diffusion region that is wider at the top thereof.

In such a structure, it is possible to more highly concentrate an electric field in a formation region of a second ring compared to a formation region of a first ring. As a result, instead of having the termination of the peripheral area dissipate the remaining portion of the electric field that was not dissipated before reaching the termination, it is possible to distribute the intensity of the electric field throughout the entire peripheral area by disposing the second rings in suitable locations. As a result, it is possible to prevent a large electric field from becoming concentrated at the termination of the peripheral area.

In an embodiment of the present invention, the plurality of guard rings have the second ring as an outermost guard ring.

In an embodiment of the present invention, there are at least 25 guard rings in the plurality of guard rings.

In an embodiment of the present invention, the plurality of guard rings have a second ring in place of every third or fourth first ring as counted from a center of the guard rings, the second ring having a uniform width in the depth profile and not having the diffusion region that is wider at the top thereof.

In an embodiment of the present invention, a specific resistance of the guard rings is 1.75 $\Omega\cdot$cm to 1.85 $\Omega\cdot$cm.

If the specific resistance of the guard rings falls within the above-mentioned range, it is possible to further increase the breakdown voltage in the peripheral area.

In an embodiment of the present invention, an impurity concentration of the guard rings is $7.4 \times 10^{15}$ cm$^{-3}$ to $8.2 \times 10^{15}$ cm$^{-3}$.

An embodiment of the present invention further includes: an insulating film formed on the semiconductor layer; and a field plate that faces the plurality of guard rings through the insulating film, wherein the plurality of guard rings include a second ring directly under the field plate, the second ring having a uniform width in the depth profile and not having the diffusion region that is wider at the top thereof.

In an embodiment of the present invention, each of the guard rings that are directly under the field plate is the second ring.

In an embodiment of the present invention, the plurality of guard rings include at least one second ring among the five guard rings located immediately outside the field plate.

In an embodiment of the present invention, an impurity concentration in the diffusion region of the first ring that is wider at the top thereof is higher than an impurity concentration in a region directly beneath the diffusion region.

An embodiment of the present invention further includes an equipotential ring outside the plurality of guard rings that is electrically connected to the semiconductor layer.

In an embodiment of the present invention, the semiconductor layer is an n-type semiconductor layer, and the guard rings are p-type guard rings.

In an embodiment of the present invention, the semiconductor layer is made of silicon.

It is to be understood that both the foregoing general description and the following detailed description are exemplary and explanatory, and are intended to provide further explanation of the invention as claimed.

BRIEF DESCRIPTION OF THE DRAWINGS

FIG. 21 is a table that shows the conditions of various simulations (various combinations of periphery-side columns).

FIG. 27 is a table that shows the simulation results illustrated in FIGS. 22 to 26.

FIG. 30 is a table that shows the relationship between breakdown voltage and specific resistance for the simulation illustrated in FIG. 22.

DETAILED DESCRIPTION OF EMBODIMENTS

Embodiments of the present invention will be explained in detail hereafter with reference to the appended drawings.

Figure 1:
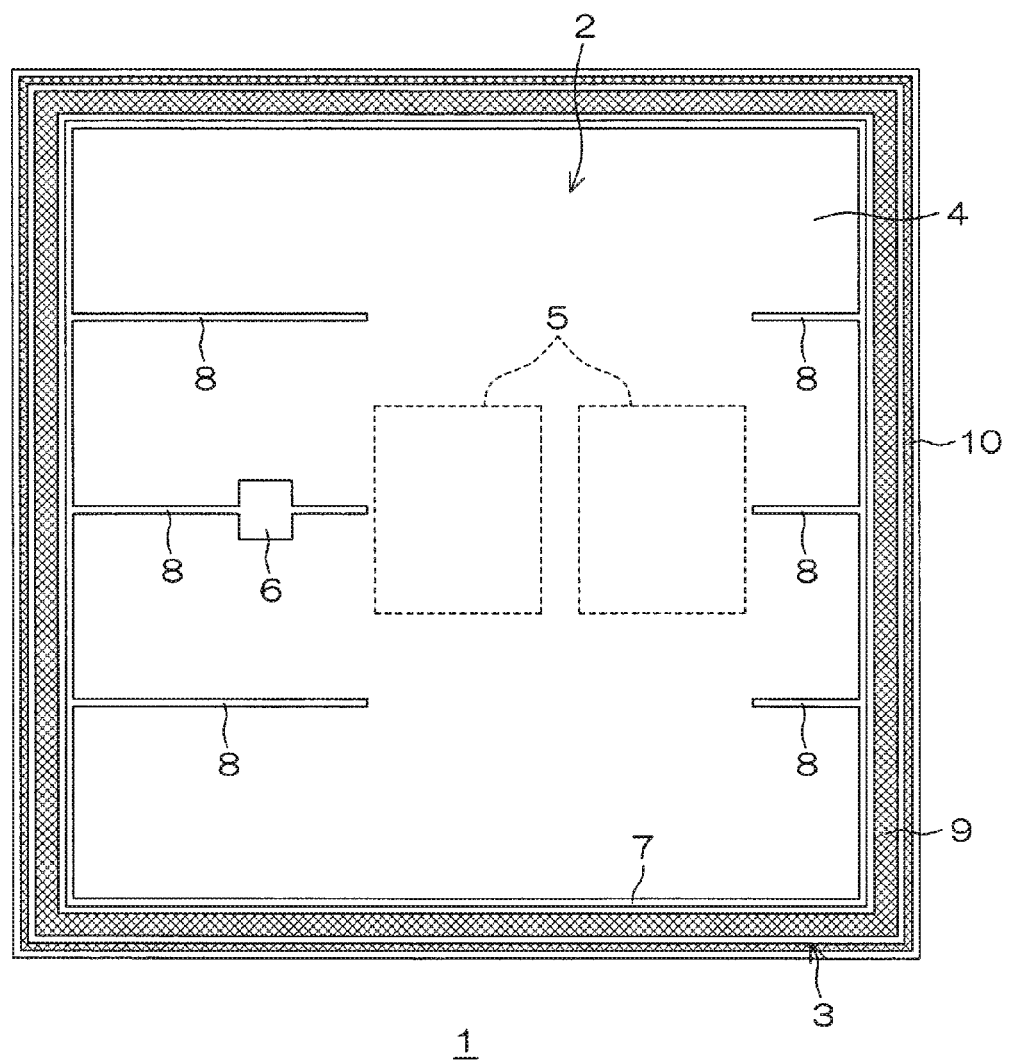
FIG. 1 is a schematic plan view of a semiconductor device according to an embodiment of the present invention.

FIG. 1 is a schematic plan view of a semiconductor device 1 according to an embodiment of the present invention.

The semiconductor device 1 may be a chip that has a square shape in a plan view, for example. A cell area 2 and a peripheral area 3 that surrounds the cell area 2 are established on the surface of the semiconductor device 1. A source pad 4 is provided so as to cover nearly all of the cell area 2. In FIG. 1, the regions surrounded by dotted lines on the source pad 4 are regions 5 in which connecting members, such as bonding wires, will be connected.

A gate pad 6 that is electrically insulated from the source pad 4 is disposed slightly to the periphery of the center of the source pad 4. A gate finger 7 is integrally connected to the gate pad 6. The gate finger 7 is formed along the periphery of the cell area 2 so as to surround a center region of the cell area 2. The gate finger 7 includes a plurality of line-shaped branching parts 8 that extend from the periphery of the cell area 2 toward the center region. The gate pad 6 is connected to one of the plurality of branching parts 8. There may be one branching part 8, or there may be more than one branching part 8.

A field plate 9 is formed so as to surround the gate finger 7, and an equipotential ring 10 is formed so as to surround the field plate 9. The field plate 9 and the equipotential ring 10 are respectively formed in a continuous loop.

The source pad 4, the gate pad 6, the gate finger 7, the field plate 9, and the equipotential ring 10 are formed of electrode films disposed in the same layer. The electrode films are formed of aluminum or another metal, for example.

Figure 2:
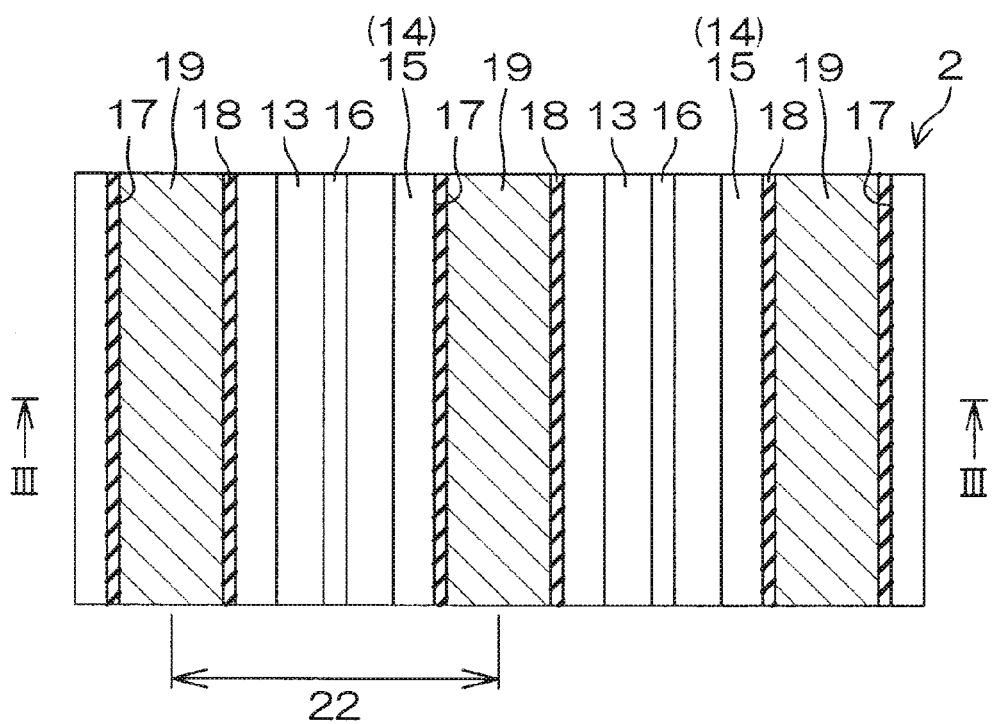
FIG. 2 is an enlarged view of main components of a cell area of the semiconductor device.
Figure 3:
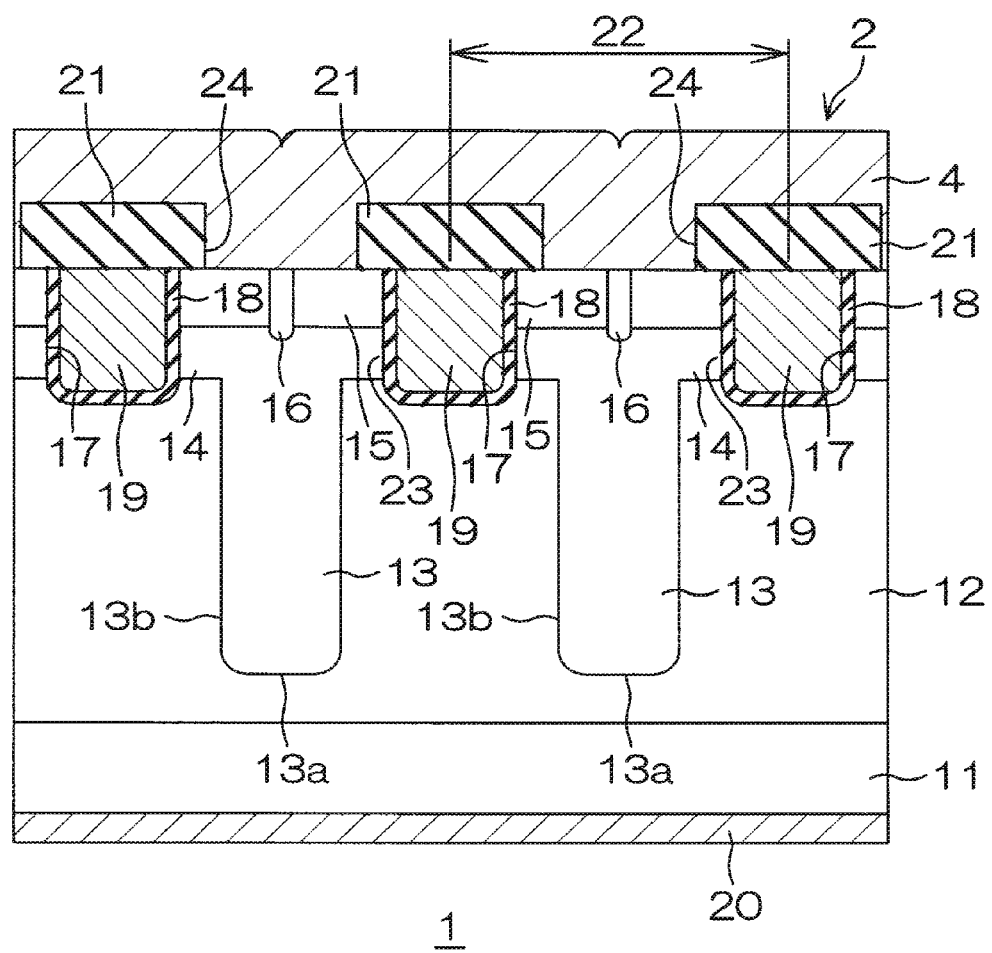
FIG. 3 is a cross-section of the cell area (a cross-section along the line III-III in FIG. 2).

FIG. 2 is an enlarged view of the main components of the cell area 2 of the semiconductor device 1. FIG. 3 is a cross-section (a cross section along the line III-III in FIG. 2) of the cell area 2.

In the present embodiment, the semiconductor device 1 is a superjunction n-channel MISFET. More specifically, the semiconductor device 1 includes: an $n^+$ drain layer 11; an n-type base layer 12; p-type column layers 13 that are one example of a cell-side column of the present invention; a p-type base layer 14; an $n^+$ source layer 15; a $p^+$ base contact layer 16; gate trenches 17; a gate insulating film 18; gate electrodes 19; and a drain electrode 20. An interlayer insulating film 21 is disposed on the gate electrodes 19, and the source pad 4 is disposed on the interlayer insulating film 21.

The $n^+$ drain layer 11 may be made of an n+ semiconductor substrate (a silicon substrate, for example). The $n^+$ semiconductor substrate may be a semiconductor substrate that has undergone crystal growth while being doped with an n-type impurity. P (phosphorous), As (arsenic), Sb (antimony) or the like can be used as the n-type impurity.

The n-type base layer 12 is a semiconductor layer that has been doped with an n-type impurity. More specifically, the n-type base layer 12 may be an n-type epitaxial layer that was epitaxially grown while being doped with the n-type impurity. The previously described materials can be used as the n-type impurity.

The p-type column layers 13 and the p-type base layer 14 are semiconductor layers that have been doped with a p-type impurity. More specifically, the p-type column layers 13 may be formed by forming deep trenches in the n-type base layer 12, and then embedding a p-type semiconductor layer in each of the deep trenches. B (boron), Al (aluminum), Ga (gallium), or the like can be used as the p-type impurity.

The p-type base layer 14 is selectively formed on a surface of the n-type base layer 12 in a plurality of regions that are periodically separated from one another in a plan view of the semiconductor device 1. As shown in the plan view of FIG. 2, the p-type base layer 14 may be disposed in a striped pattern, for example. Alternatively, a p-type base layer 14 with a rectangular shape may be disposed in a staggered pattern. In addition, a p-type base layer 14 with a hexagonal shape may be disposed in a staggered pattern. Respective regions that include a portion of the p-type base layer 14 and the surrounding n-type base layer 12 each form a cell 22 as a result of being partitioned by the gate trenches 17. In other words, this semiconductor device 1 has a large number (a plurality) of cells 22 arranged in a striped pattern in a plan view.

The p-type column layer 13 is formed in a region to the inside of the p-type base layer 14 in each of the cells 22 in a plan view. More specifically, in the present embodiment, the p-type column layer 13 is formed in a shape (a striped pattern in the case of FIG. 2) similar to the shape of the p-type base layer 14, for example, in a substantially central region of the p-type base layer 14 in a plan view. The p-type column layer 13 is formed so as to be continuous with the p-type base layer 14, and extends toward the $n^+$ drain layer 11 to a location in the n-type base layer 12 that is deeper than that of the p-type base layer 14. In other words, the p-type column layer 13 is formed in a substantial column shape in the cross section shown in FIG. 3. A bottom face 13a of the p-type column layer 13 is disposed in a location closer to the $n^+$ drain layer 11 than the center of the n-type base layer 12 in the thickness direction thereof. The thickness of the p-type column layer 13 is 30 μm to 60 μm, for example. The bottom face 13a (an interface with the n-type base layer 12) of the p-type column layer 13 faces the surface (the top face in FIG. 3) of the $n^+$ drain layer 11, with the n-type base layer 12 sandwiched therebetween, in the thickness direction thereof. Side faces 13b (interfaces with the n-type base layer 12) of the p-type column layer 13 respectively face a side face 13b of an adjacent p-type column layer 13 with the n-type base layer 12 sandwiched therebetween.

The n+ source layer 15 is formed across the entire surface of the p-type base layer 14 in the respective cells 22 in a plan view. The $n^+$ source layer 15 may be formed by using ion implantation to selectively implant an n-type impurity in the p-type base layer 14. Examples of such an n-type impurity were given above. The side faces of the gate trenches 17 are formed via the $n^+$ source layer 15, the p-type base layer 14, and the n-type base layer 12. In other words, the $n^+$ source layer 15, the p-type base layer 14, and the n-type base layer 12 are vertically adjacent to each other along the side faces of the gate trench 17. As a result, the p-type base layer 14 is interposed between the $n^+$ source layer 15 and the n-type base layer 12 in a side face region of the gate trench 17. This interposing side face region provides a channel region 23.

The $p^+$ base contact layer 16 is formed in a shape (a striped pattern in the case of FIG. 2) similar to the shape of the p-type base layer 14, for example, in a region directly above the p-type column layer 13 in a plan view. The $p^+$ base contact layer 16 extends through the $n^+$ source layer 15 toward the $n^+$ drain layer 11 to a location in the middle of the p-type base layer 14. The $p^+$ base contact layer 16 may be formed by using ion implantation to selectively implant a p-type impurity in the p-type base layer 14. Examples of such a p-type impurity were given above.

The gate insulating film 18 may be a silicon oxide film, a silicon nitride film, a silicon oxynitride film, a hafnium oxide film, an alumina film, a tantalum oxide film, or the like, for example. The gate insulating film 18 is formed so as to cover an inner surface of the gate trench 17. The gate insulating film 18 may be formed at a uniform thickness, or may be formed such that only the portion at the bottom of gate trench 17 is selectively thick, for example.

Each gate electrode 19 is formed so as to face the channel region 23 across the gate insulating film 18. The gate electrode 19 may be made of polysilicon that has been doped with impurities to lower the resistance thereof, for example. In the present embodiment, the gate electrode 19 is embedded to the inside of the gate insulating film 18 in the gate trench 17. In other words, the gate electrode 19 faces the $n^+$ source layer 15, the channel region 23, and the n-type base layer 12, which all contact the side face of the gate trench 17. As a result, the gate electrodes 19 are formed so as to mutually control a plurality of the cells 22.

The interlayer insulating film 21 is made of an insulating material such as a silicon oxide film, a silicon nitride film, or TEOS (tetraethyl orthosilicate), for example. The interlayer insulating film 21 covers the top surface of each gate electrode 19, and is formed in a pattern that has a contact hole 24 in a central region of the $n^+$ source layer 15 in the respective cells 22.

The source pad 4 is formed so as to cover the surface of the interlayer insulating film 21 and fit into the contact holes 24 in the respective cells 22. This causes the source pad 4 to be in ohmic contact with the $n^+$ source layer 15. Therefore, the source pad 4 is connected to the plurality of cells 22 in parallel, and is configured such that all of the current flowing to the plurality of the cells 22 flows through the source pad 4. In addition, the source pad 4 is in ohmic contact with the $p^+$ base contact layer 16 in the respective cells 22 via the contact holes 24, and stabilizes the potential of the p-type base layer 14 via the $p^+$ base contact layer 16.

The drain electrode 20 is made of aluminum or another metal. The drain electrode 20 is formed on the rear face (the surface opposite to the n-type base layer 12; the bottom face in FIG. 3) of the $n^+$ drain layer 11. Thus, the drain electrode 20 is connected to the plurality of cells 22 in parallel, and is configured such that all of the current flowing to the plurality of the cells 22 flows through the drain electrode 20.

When the drain electrode 20 has a high potential, the source pad 4 has a low potential, and a direct current power source is connected between the source pad 4 and the drain electrode 20, a reverse bias will be given to a parasitic diode formed by combining the p-type column layer 13 and a p-n junction of the p-type base layer 14 and the n-type base layer 12. At this time, if a control voltage that is smaller than a prescribed threshold voltage is applied to the gate electrodes 19, no current paths will be formed between the source and the drain. In other words, the semiconductor device 1 turns OFF. On the other hand, if a control voltage that is greater than or equal to the threshold voltage is applied to the gate electrodes 19, electrons will be attracted to the surface of the channel region 23 and an inversion layer (channel) will be formed. As a result, the n+ source layer 15 and the n-type base layer 12 become electrically connected. In other words, a current path from the source pad 4 to the drain electrode 20 is formed so as to pass through the $n^+$ source layer 15, the inversion layer of the channel region 23, the n-type base layer 12, and the $n^+$ drain layer 11, in that order. In other words, the semiconductor device 1 turns ON.

Figure 4:
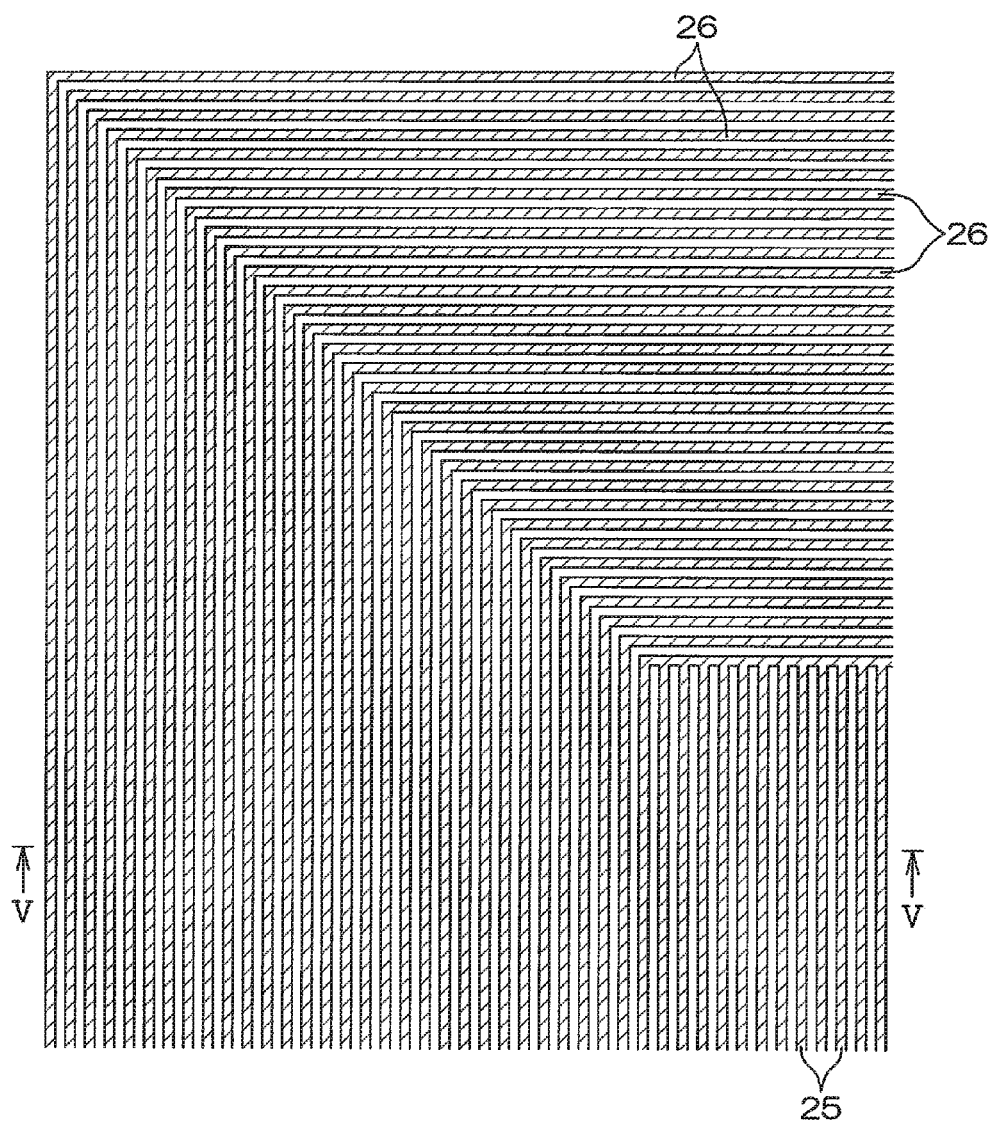
FIG. 4 is an enlarged view of main components of a peripheral area of the semiconductor device.
Figure 5:
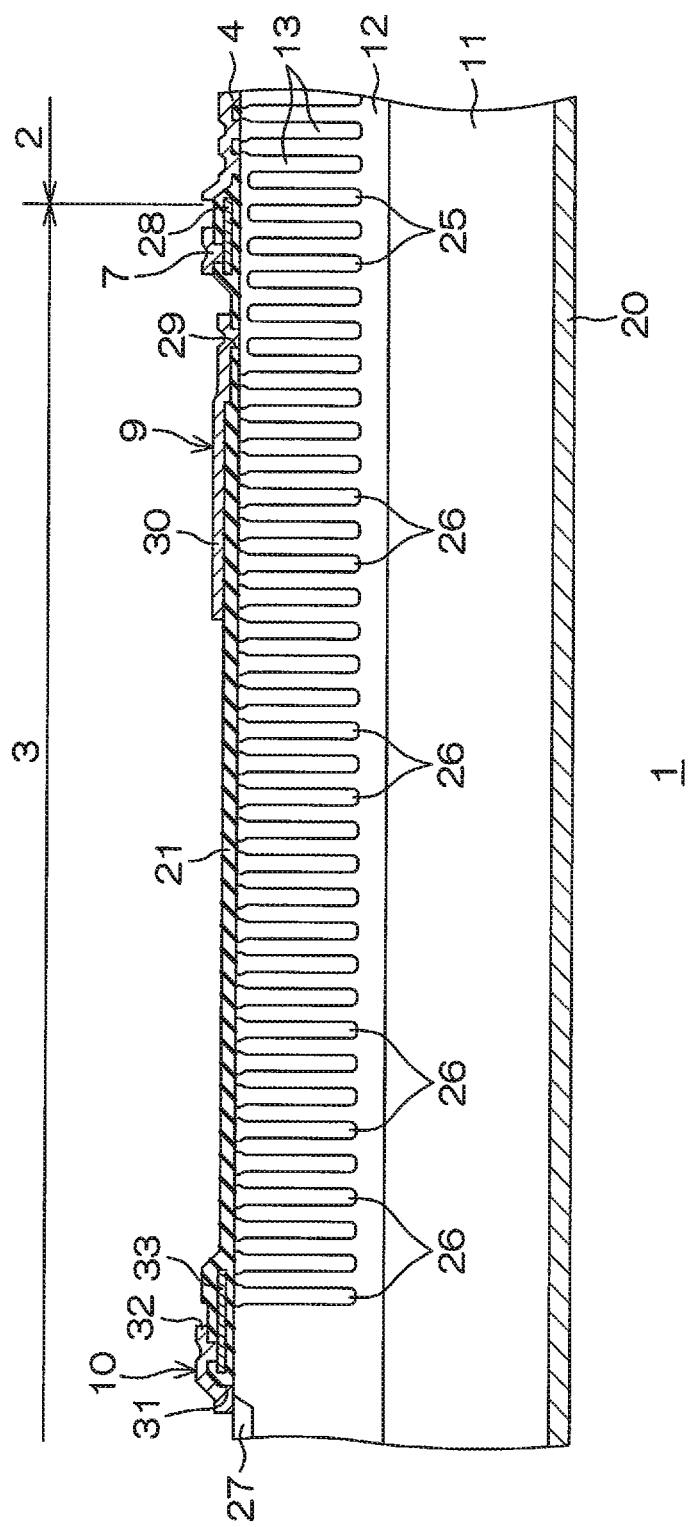
FIG. 5 is a cross-section of the peripheral area (a cross-section along the line V-V in FIG. 4).

FIG. 4 is an enlarged view of the main components of the peripheral area 3 of the semiconductor device 1. FIG. 5 is a cross-section (a cross-section along the line V-V in FIG. 4) of the peripheral area 3.

The semiconductor device 1 contains the following in the peripheral area 3: p-type RESURF (reduced surface field) layers 25; periphery-side p-type column layers 26, which are one example of the guard rings of the present invention; an end face p-type layer 27; the gate finger 7; the field plate 9; and the equipotential ring 10.

In the present embodiment, the p-type RESURF layers 25 are formed in a stripe shape parallel to the p-type column layers 13 when seen in a plan view. A plurality of p-type RESURF layers 25 are formed so that upper portions thereof are continuous with each other. The area occupied by the plurality of p-type RESURF layers 25 overlaps the area between the source pad 4 and the field plate 9, for example. The respective p-type RESURF layers 25 are formed during the same step as the p-type column layers 13, and thus have the same depth thereof.

In the present embodiment, the periphery-side p-type column layers 26 form guard rings that are formed in a continuous loop that surrounds the cell area 2 when seen in a plan view. There may be 25 or more periphery-side p-type column layers 26, for example, with 25 to 40 being preferable. As shown in FIG. 4, the innermost periphery-side p-type column layer 26 is formed so as to be continuous with respective ends of a plurality of p-type RESURF layers 25. In addition, the respective periphery-side p-type column layers 26 are formed during the same step as the p-type column layers 13 and the p-type RESURF layers 25, and thus have the same depth thereof. In other words, the p-type RESURF layers 25 and the periphery-side p-type column layers 26 may be respectively formed by forming a deep trench that has the same depth in the n-type base layer 12 as the p-type column layers 13, and then embedding a p-type semiconductor layer inside the deep trench.

The end face p-type layer 27 is formed on the surface of the n-type base layer 12 so as to contact the end face and the surface of the n-type base layer 12. The end face p-type layer 27 is formed during the same step as the p-type base layer 14, and thus has the same depth thereof. This depth may be 10 μm to 20 μm, for example.

The gate finger 7 is formed on the interlayer insulating film 21 so as to face the plurality of p-type RESURF layers 25. In this region, gate wiring 28, which is made of polysilicon in which the resistance has been lowered, for example, is provided within the interlayer insulating film 21. The gate finger 7 is connected to this gate wiring 28. The gate wiring 28 is continuous with the gate electrodes 19 in prescribed locations in the cell area 2; thus, the gate finger 7 and the gate electrodes 19 are electrically connected.

The field plate 9 is connected to the p-type RESUF layers 25 via contact holes 29 formed in the interlayer insulating film 21. The field plate 9 is drawn out on top of the interlayer insulating film 21 from the contact location toward the end face (exterior) of the semiconductor device 1. A drawn-out portion 30 of the field plate 9 faces a plurality of periphery-side p-type column layers 26 through the interlayer insulating film 21.

The equipotential ring 10 is connected to the end face p-type layer 27 via a contact hole 31 formed in the interlayer insulating film 21. On top of the interlayer insulating film 21, the equipotential ring 10 is drawn out from the contact location away from the end face (toward the interior) of the semiconductor device 1. An equipotential ring electrode 33, which is formed of polysilicon in which the resistance has been lowered, for example, is provided inside the interlayer insulating film 21 so as to face a drawn-out portion 32 of the equipotential ring 10. The equipotential ring 10 is connected to the equipotential ring electrode 33. The equipotential ring electrode 33 faces at least the outermost periphery-side column layer 26.

Figure 6:
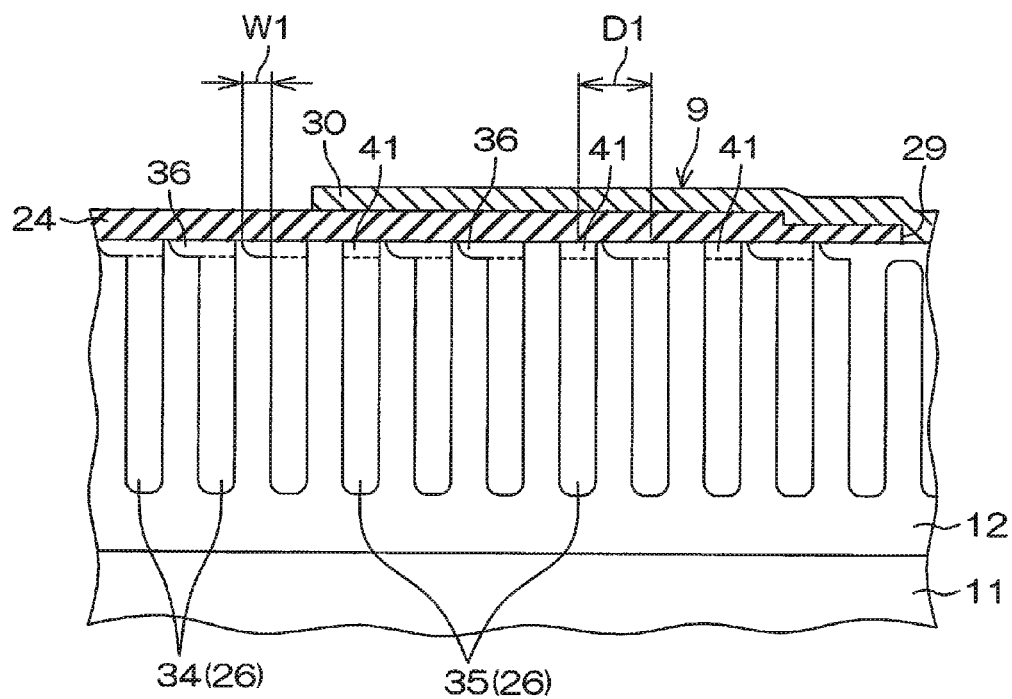
FIG. 6 illustrates the shape of periphery-side columns.

Next, the periphery-side p-type column layers 26 will be explained in detail with reference to FIG. 6. FIG. 6 illustrates the shape of the periphery-side p-type column layers 26.

The periphery-side p-type column layers 26 may include two types of guard rings: a first ring 34, and a second ring 35. All of the periphery-side p-type column layers 26 may be first rings 34, or second rings 35 may be provided between adjacent first rings 34.

The first rings 34 respectively have a diffusion region 36 at the top of the column (main body) thereof that has a substantially uniform width in the depth direction. The diffusion region 36 extends toward the end face (exterior) of the semiconductor device 1. In other words, at the top of the first ring 34, the diffusion region 36 selectively extends only in one direction (toward the end face of the semiconductor device 1) from the center of the column. Therefore, as shown in the cross-section in FIG. 6, an inner side surface of the first ring 34 is substantially linear so as to be symmetric with respect to an outer side surface of the first ring 34 along the depth direction thereof. The diffusion region 36 that extends outward may be formed in a continuous loop along the entire circumference of the first ring 34, or may have a portion that is selectively not formed along a section of the circumference. An extension width W1 of the diffusion region 36 may be 0.2 to 0.6 times the distance D1 (center-to-center distance) between adjacent periphery-side p-type column layers 26. After the columns have been formed by performing the above-mentioned steps of forming the deep trenches and embedding p-type layers in the deep trenches, the diffusion regions 36 may be formed through a mask with a prescribed pattern by conducting ion implantation to selectively implant a p-type impurity in the surface of the column.

The second ring 35 has the same structure as the first ring 34, except for the fact that while the second ring 35 does have a diffusion region 41 with a substantially uniform width in the depth direction at the top of the column (main body), the diffusion region 41 does not extend outward. Therefore, as shown in the cross-section in FIG. 6, an inner side surface and an outer side surface of the second ring 35 both have a substantially linear shape in the depth direction. The diffusion region 41 is formed during the same ion implantation step as the diffusion region 36. The structure of the second ring 35 can also be applied to the p-type column layers 13 in the cell area 2.

In addition, when embedded layers (which correspond to a p-type embedded layer 37 that will be explained later) of the first ring 34 and the second ring 35 are formed, the impurity concentration of the p-type impurity may be $1.0 \times 10^{15}$ cm$^{-3}$ to $1.0 \times 10^{17}$ cm$^{-3}$ for example, with $5.0 \times 10^{15}$ cm$^{-3}$ to $1.0 \times 10^{17}$ cm$^{-3}$ being preferable. By implanting a p-type impurity such that the impurity concentration falls within the above-mentioned range, it is possible to set the specific resistance of the p-type embedded layer to between 1.75 Ω·cm and 1.85 Ω·cm, for example. In addition, the impurity concentration when forming the diffusion regions 36, 41 may be $1.0 \times 10^{13}$ cm$^{-3}$ to $1.0 \times 10^{15}$ cm$^{-3}$ for example, with $5.0 \times 10^{13}$ cm$^3$ to $5.0 \times 10^{14}$ cm$^3$ being preferable.

Figure 7A:
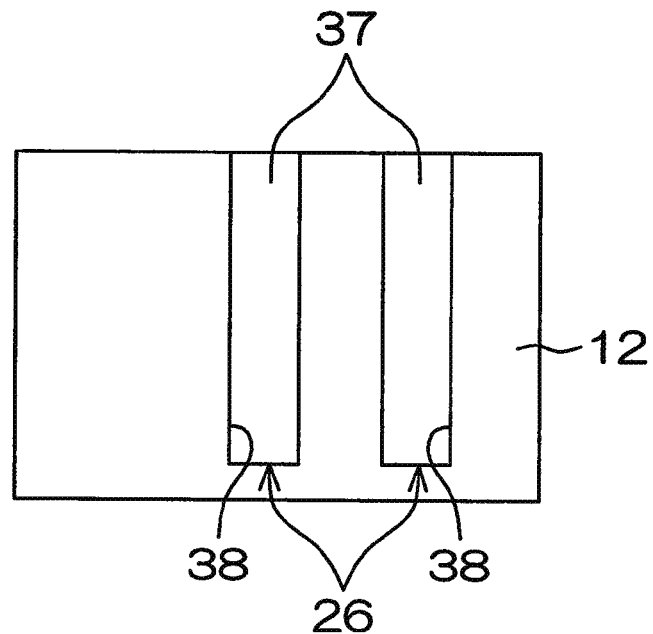
FIGS. 7A and 7B illustrate the distribution of specific resistance in the periphery-side columns.
Figure 7B:
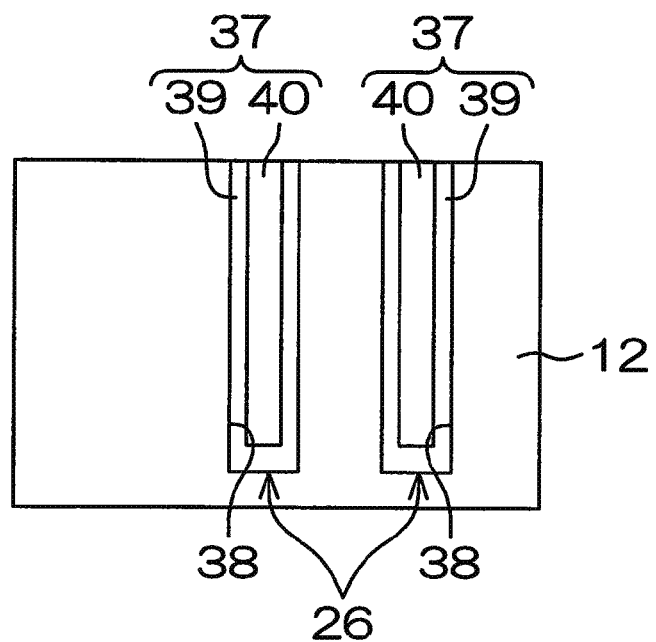

Next, the specific resistance of the p-type embedded layer 37 will be explained with reference to FIGS. 7A and 7B. FIGS. 7A and 7B illustrate the distribution of specific resistance in the periphery-side p-type column layers 26.

As mentioned above, the periphery-side p-type column layers 26 may respectively be formed of a p-type embedded layer 37 embedded inside a deep trench 38. As shown in FIG. 7A, the p-type embedded layer 37 may be a layer that has a substantially uniform specific resistance, or the embedded layer 37 may also be a layer which contains differing specific resistances. An example of the latter is shown in FIG. 7B. In other words, the p-type embedded layer 37 may include an outer layer 39 that is formed along the inner surface of the deep trench 38, and an inner layer 40 that is embedded inside the outer layer 39 and that has a specific resistance smaller than that of the outer layer 39. It is preferable that the specific resistance of the outer layer 39 be 1.75 Ω·cm to 1.85 Ω·cm.

An embodiment of the present invention was described above, but the present invention can also be implemented in other embodiments.

A configuration in which the conductivity type of the various semiconductor components of the semiconductor device 1 has been reversed may also be used, for example. In other words, in the semiconductor device 1, the p-type components may be n-type and the n-type components may be p-type.

In addition, in the above-mentioned embodiment, only a MISFET with a trench gate structure was shown in the drawings as the element formed in the cell area 2. However, another type of element (a MISFET with a planar gate structure, an IGBT, a diode, or the like, for example) may be formed in the cell area 2.

Furthermore, an example was shown (FIGS. 7A and 7B, for example) in which p-type embedded layers 37 were embedded in deep trenches 38 to form the p-type column layers 13, the p-type RESURF layers 25, and the periphery-side p-type column layers 26. However, these various column layers may also be formed using multi-epitaxial technology (multi-epi).

Besides these, various modifications in design can be made within the scope of the claims.

Verification Examples

Next, the present invention will be described in accordance with verification examples that were used in simulations. The present invention is not limited to these verification examples, however. Only reference characters from FIGS. 1 to 7B that are necessary to explain the various verification results will be used in the following description of the verification examples. References to any other reference characters will be omitted. In addition, in the following description, "an extended diffusion region" corresponds to the diffusion region 36, and "a column" corresponds to the main body (which includes the non-extended portion of the diffusion region 36) of a periphery-side p-type column layer 26 in which the width in the depth direction is substantially uniform.

<Relationship Between Specific Resistance and Breakdown Voltage (1)>

A simulation regarding the relationship between specific resistance and breakdown voltage was conducted using a structure in which all of the periphery-side p-type column layers 26 were second rings 35. The various values calculated via the simulation are shown in FIG. 8.

Figure 8:
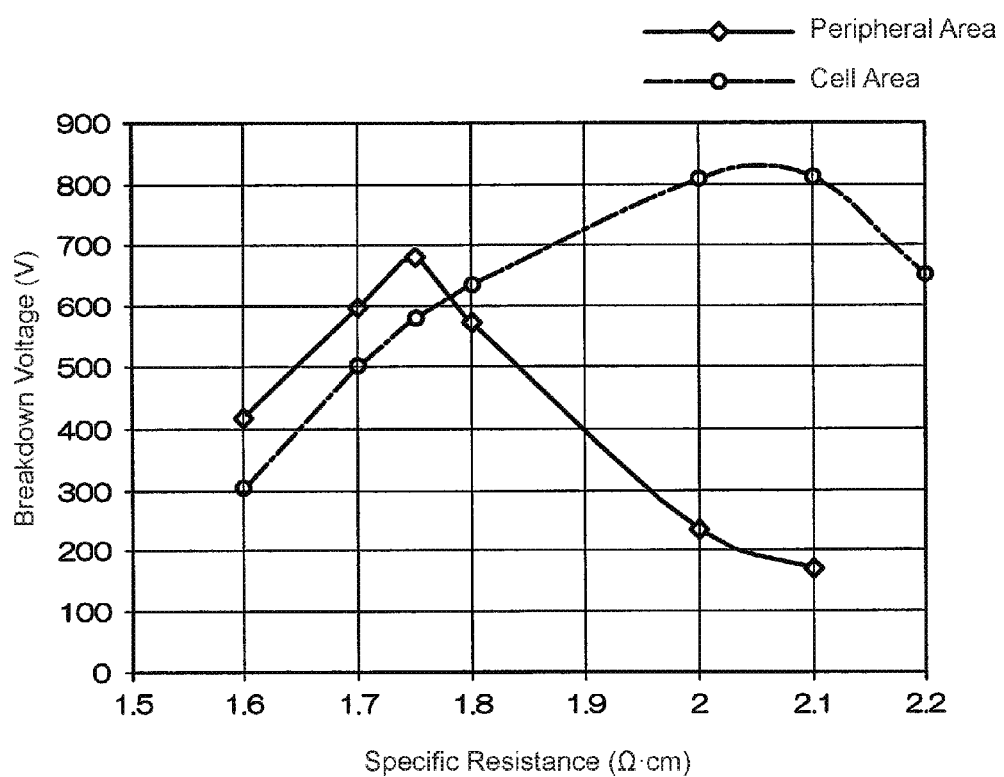
FIG. 8 is a graph that shows a relationship between breakdown voltage and specific resistance in the peripheral area.

The results shown in FIG. 8 show that the breakdown voltage of the peripheral area 3 is highest when the specific resistance ρ equals 1.75 Ω·cm. Also according to the results of the simulation, the breakdown voltage of the peripheral area 3 was lower than the breakdown voltage of the cell area 2. Thus, in the structure used in the simulation, it would be reasonable to expect that the breakdown voltage is limited in the peripheral area 3. However, precision during the simulation was not the same for the peripheral area 3 and the cell area 2. Therefore, it is preferable that the graph in FIG. 8 be used as a relative comparison and not a comparison of absolute values.

In the simulation shown in FIG. 8, calculations were made using the structure shown in FIG. 7A for the periphery-side p-type column layers 26. However, calculations were also made using the structure shown in FIG. 7B. Specifically, the specific resistance ρ of the outer layer 39 was set to 1.75 Ω·cm and the specific resistance ρ of the inner layer 40 was set to 1.6 Ω·cm. As a result of the simulation, it was learned that there was very little difference in breakdown voltage between the structure shown in FIG. 7B, in which the periphery-side p-type column layers 26 had two layers, and the structure shown in FIG. 7A, in which the periphery-side p-type column layers 26 had one layer. Thus, the results of the simulation confirmed that, in the peripheral area 3, the growth of the depletion layer and the location in which the electric field became concentrated tended to be determined by the impurity concentration in the outer portion of the column (the portion contacting the inner surface of the deep trench 38), and that there was no relationship between breakdown voltage and the specific resistance of the inner portion of the column. Therefore, as will be shown next, a simulation was conducted regarding the electric field distribution in a structure in which first rings 34 were introduced into the periphery-side p-type column layers 26. This simulation investigated whether or not such a structure could increase the breakdown voltage in the peripheral area 3 compared to the current structure in which all of the periphery-side p-type column layers 26 were second rings 35.

<Verification of Results of Introducing an Extended Diffusion Region (1)>

Figure 9:
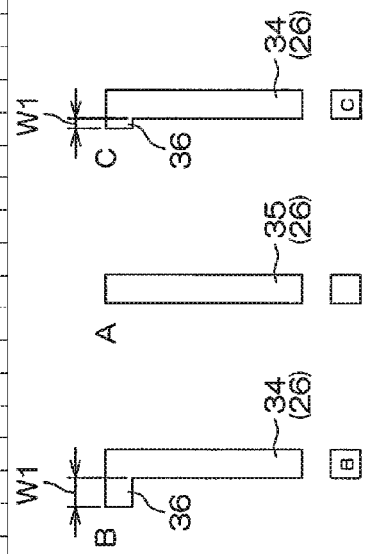
FIG. 9 is a table that shows the conditions of various simulations (various combinations of the periphery-side columns).

FIG. 9 shows a table that includes the various calculated breakdown voltages, the purpose for each of the simulations, and the various combinations of A-type and B-type columns. An A-type column has the same structure as a second ring 35, while a B-type column and a C-type column have the same structure as a first ring 34. The difference between a B-type column and a C-type column lies in the extension width W1 of the extended diffusion region 36. The width W1 of a B-type column is 3.75 μm (with the distance D1 between columns being 7.7 μm), and the width W1 of a C-type column is 1.93 μm. In FIG. 9, the numbers 1 to 31 used for the deep trenches respectively represent the number of the corresponding periphery-side p-type column layer 26, starting with the column closest to the end face of the semiconductor device 1 and then moving inward.

Figure 10:
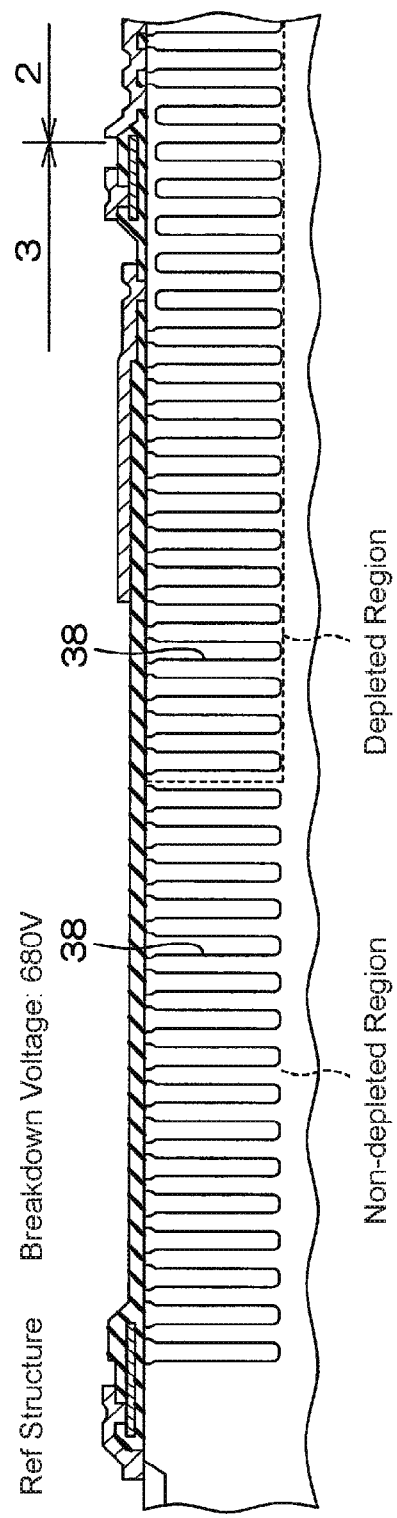
FIG. 10 is used to explain the results of one of the simulations.

As shown in FIG. 10, in the Ref. structure, the depletion extends only about halfway (to the $13^{th}$ or $14^{th}$ deep trench) through the 31 deep trenches 38, thus showing that the intensity of the electric field is supported within a narrow range. Since the breakdown voltage corresponds to a value in which the intensity of the electric field has been spatially integrated, having a larger depleted region, which is the integration range for the actual breakdown voltage value over a particular space, can reduce the overall size of the electric field. In other words, having a larger depleted region is advantageous in reducing the concentration of the electric field. Therefore, it is anticipated that such a structure will have the effect of expanding the depletion layer within the non-depleted region of the Ref structure, in which over half of the columns are not being used.

Figure 11:
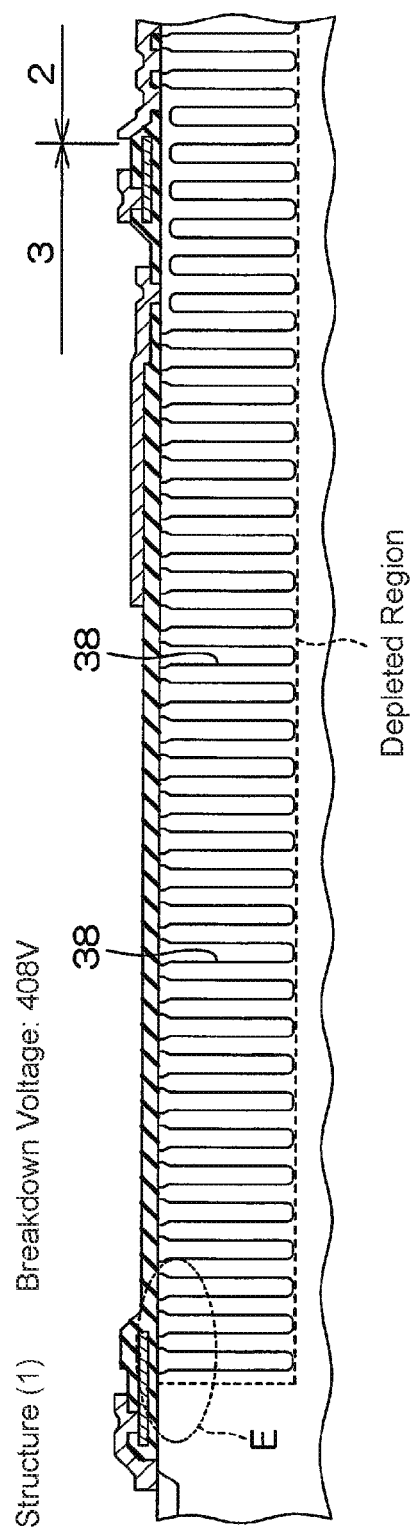
FIG. 11 is used to explain the results of one of the simulations.

However, as shown in FIG. 11, the depletion layer extends to the termination of the semiconductor device 1 when all 31 of the deep trenches 38 have B-type columns. This results in an increased impact ionization rate near the surface of the terminal columns (dotted line E), which leads to a breakdown voltage that is equal to or less than that of the Ref structure. Thus, as shown in structures (3) to (5) in FIG. 9, it was investigated as to how various combinations of A-type columns and B-type columns would affect the distribution of the electric field and how the breakdown voltage would change accordingly.

Figure 12:
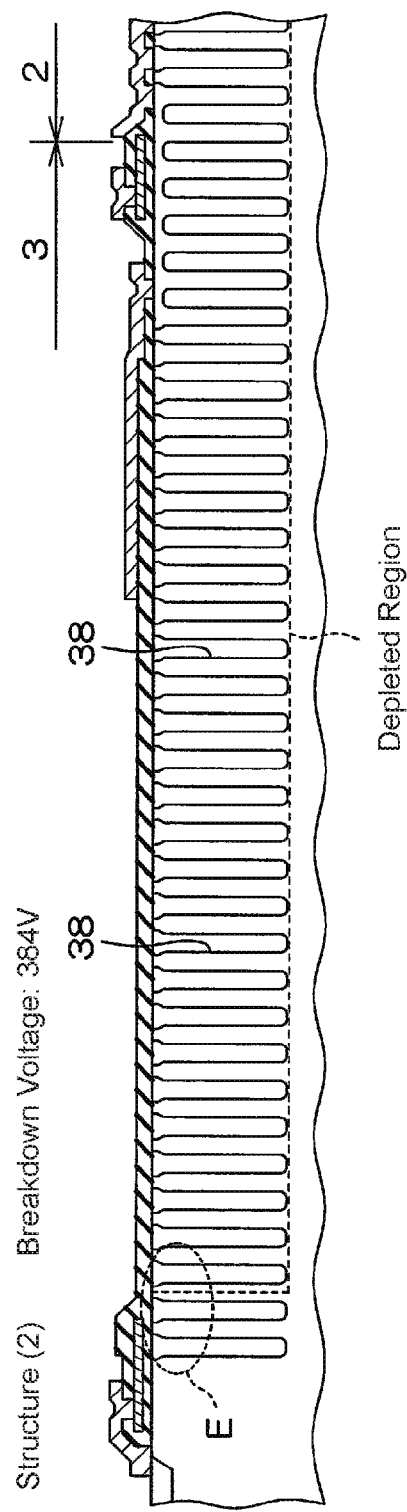
FIG. 12 is used to explain the results of one of the simulations.

As shown in FIG. 12, it was learned that by replacing some of the 31 B-type columns with A-type columns, the electric field could be intentionally concentrated in locations where the A-type columns were formed. As a result, while the electric field no longer became concentrated near the termination (dotted-line E), the breakdown voltage was approximately 20V lower than in structure (1) in FIG. 11. Thus, it was learned that it is preferable to extend the depletion layer outward to improve the breakdown voltage.

Figure 13:
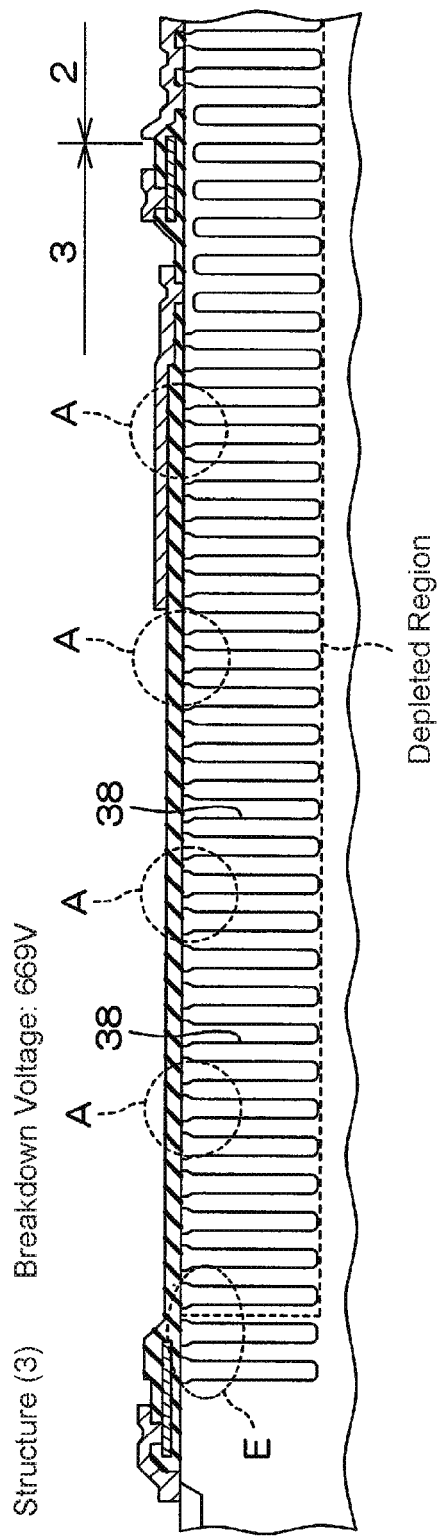
FIG. 13 is used to explain the results of one of the simulations.
Figure 14:
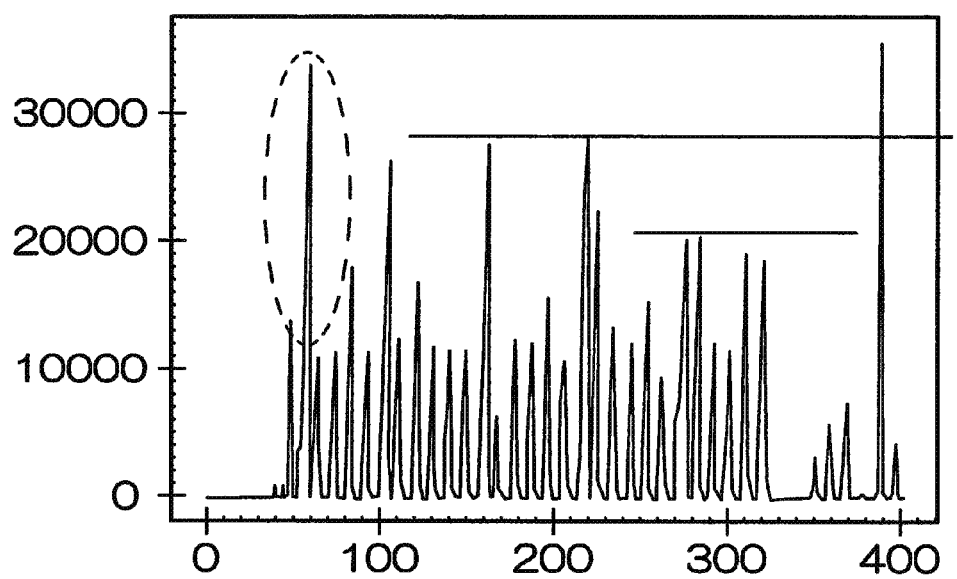
FIG. 14 is an electric field profile based on the simulation results illustrated in FIG. 13.

Next, as shown in FIG. 13, it was learned that by disposing A-type columns at equally-spaced intervals, the electric field could be intentionally concentrated in locations (dotted line A) where A-type columns had been formed, and that the electric field intensity near the termination (dotted line E) could be reduced. However, it can be seen by referring to the electric field profile in FIG. 14 that the electric field at the termination is still large (the dotted line section in FIG. 14). It was therefore anticipated that a higher breakdown voltage could be achieved by reducing the concentration of the electric field. Thus, a structure was evaluated in which A-type columns were disposed at equally-spaced intervals that were even closer together. This structure was structure (4), the results of which are shown in FIGS. 15 and 16.

Figure 15:
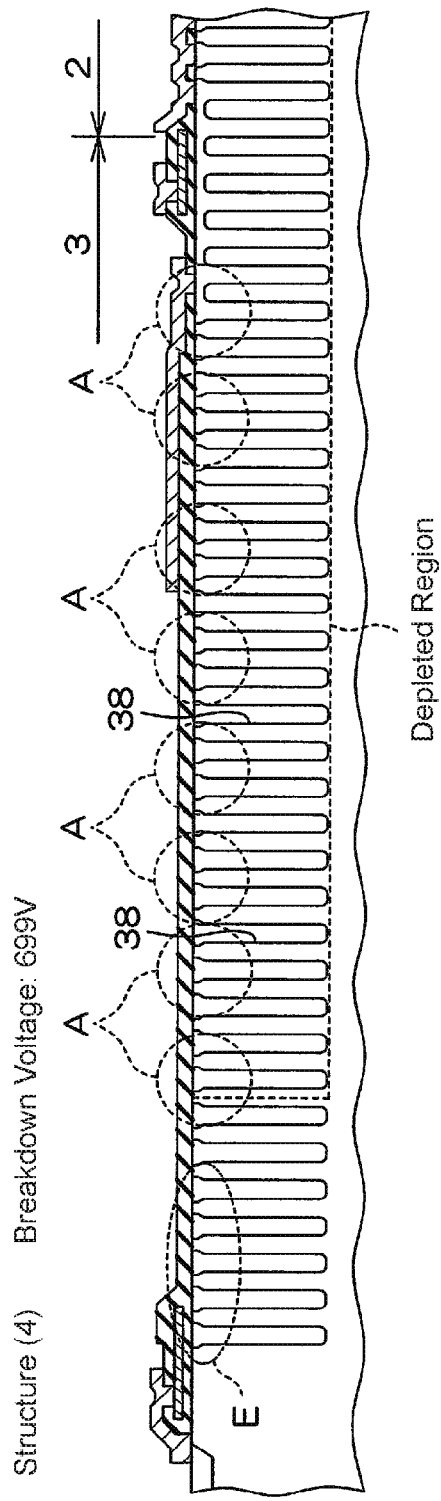
FIG. 15 is used to explain the results of one of the simulations.
Figure 16:
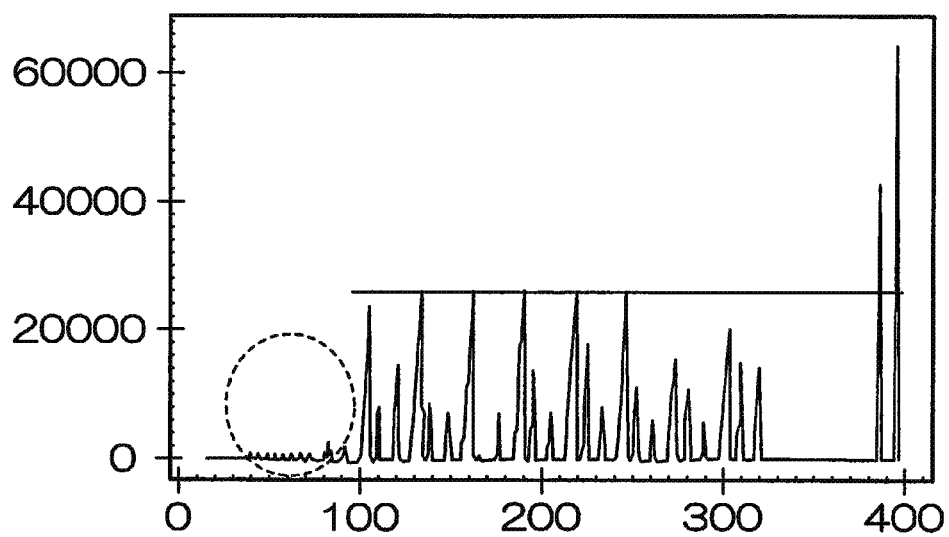
FIG. 16 is an electric field profile based on the simulation results illustrated in FIG. 15.

As shown in FIG. 15, the concentration of the electric field at the termination (dotted line E) was reduced, as hoped. However, the intensity of the electric field was no longer supported by the termination. This result becomes clear after looking at the electric field profile in FIG. 16 (the dotted line section of FIG. 16). It is believed that this is due to there being too many A-type columns in the depleted region, thus causing the electric field to be dissipated by the A-type columns before reaching the termination. In addition, it was learned from the results of structure (3) and structure (4) that there is a large difference in how much the electric field is dissipated when comparing instances in which A-type columns are disposed near the cell area 2 to instances in which A-type columns are disposed near the termination. In other words, it is preferable for a large number of A-type columns to be disposed near the cell area 2 in order for a less-intense electric field to be distributed throughout the peripheral area 3.

Figure 17:
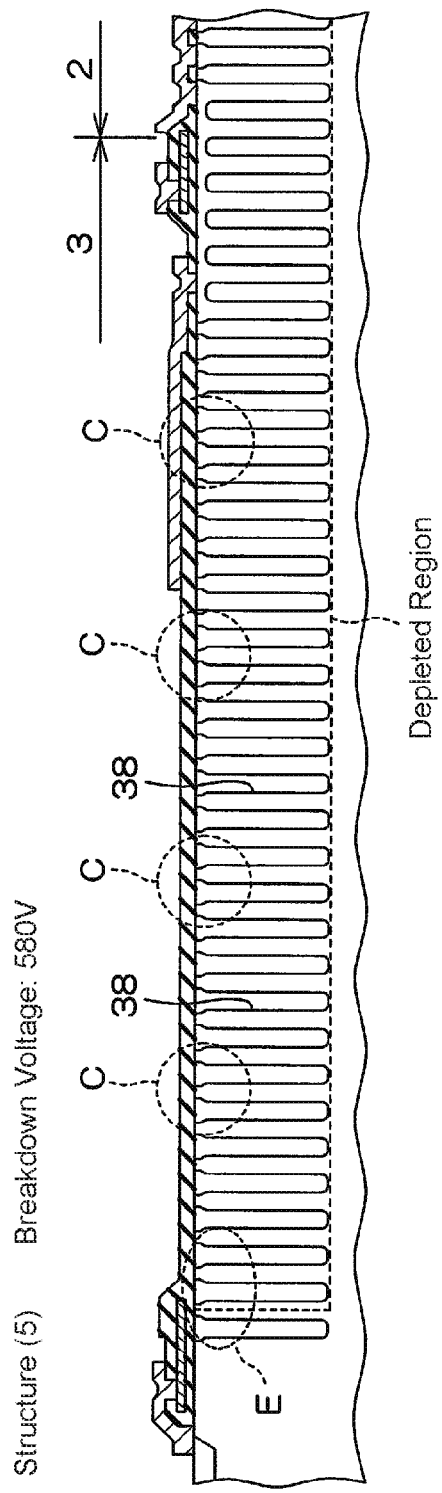
FIG. 17 is used to explain the results of one of the simulations.
Figure 18:
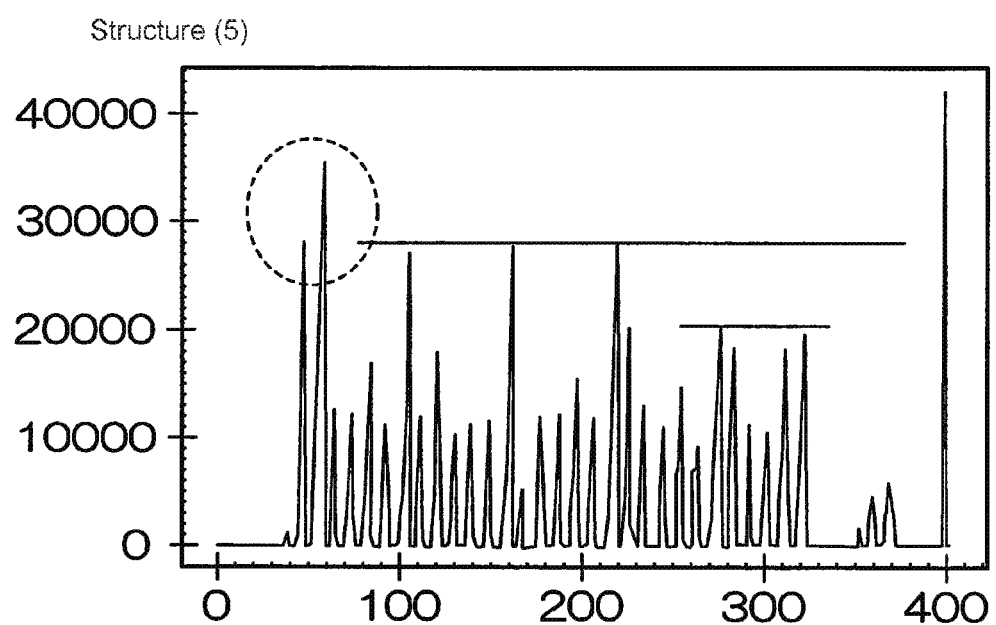
FIG. 18 is an electric field profile based on the simulation results illustrated in FIG. 17.

Next, the results of the simulation for structure (5) shown in FIG. 17 and the results of the simulation for structure (3) shown in FIG. 13 will be compared. In structure (5), C-type columns are used in place of the A-type columns used in structure (3). The arrangement of the B-type columns is the same in both structures, however. As a result, as shown in FIG. 17, the locations (dotted line C) where the electric field becomes concentrated are the locations where the C-type columns are formed. These locations are the same as the locations in FIG. 13 where the A-type columns were formed. However, the breakdown voltage in structure (5) is approximately 100V smaller than that of structure (3). Since this is difficult to explain by comparing the electric field profile in FIG. 14 with the electric field profile in FIG. 18, differences in potential drops between the two structures were evaluated using potential distribution. The results are shown in FIGS. 19 and 20.

Figure 19:
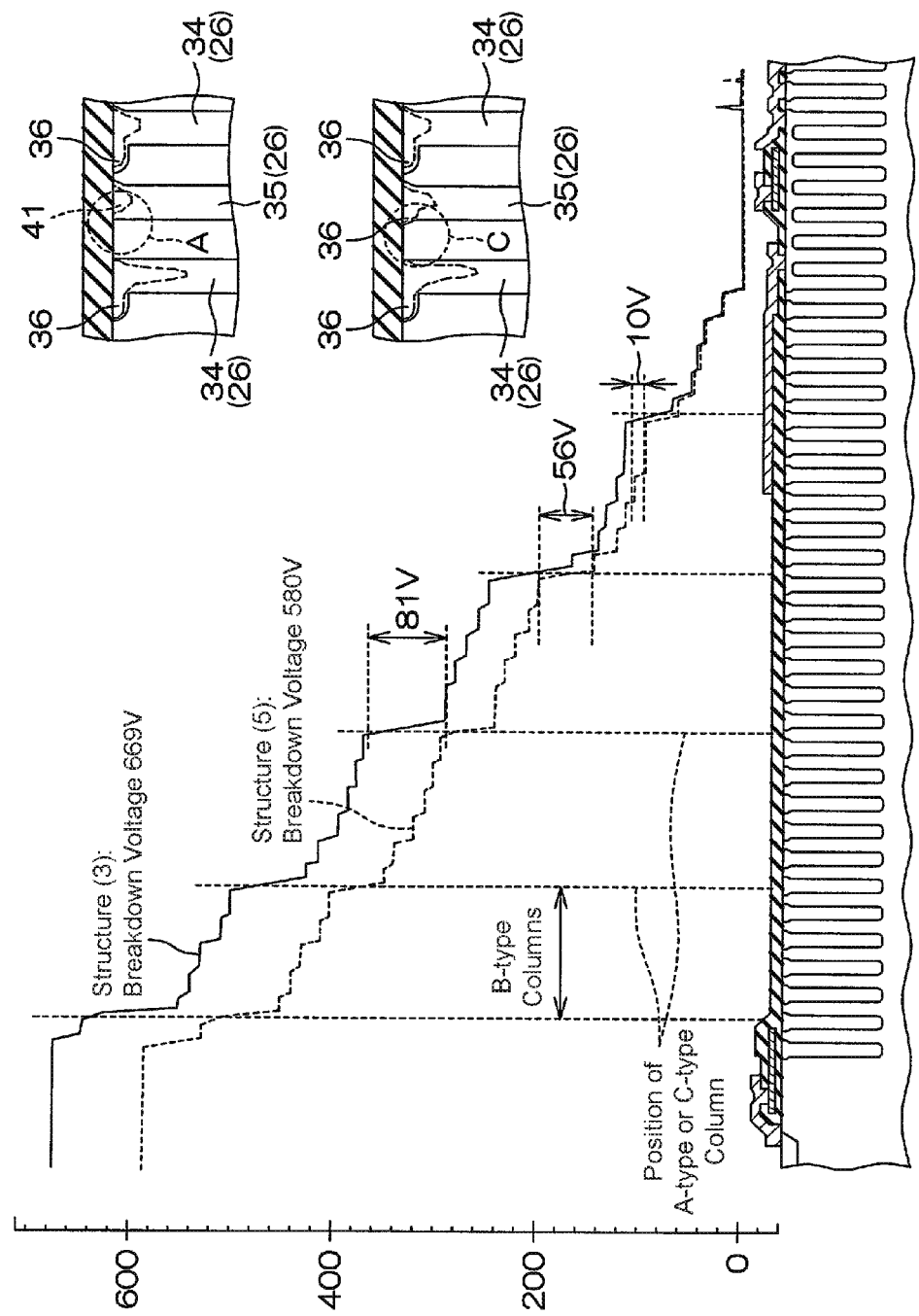
FIG. 19 is a profile of potential drops based on the simulation results illustrated in FIGS. 13 and 17.

As shown in FIG. 19, the numerical values for potential drops varied according to the shape of the diffusion region. The potential drop decreased as the size (the extension width W1) of the diffusion region became larger. FIG. 20 shows the relationship between the size of the diffusion region and the potential drop values.

Figure 20:
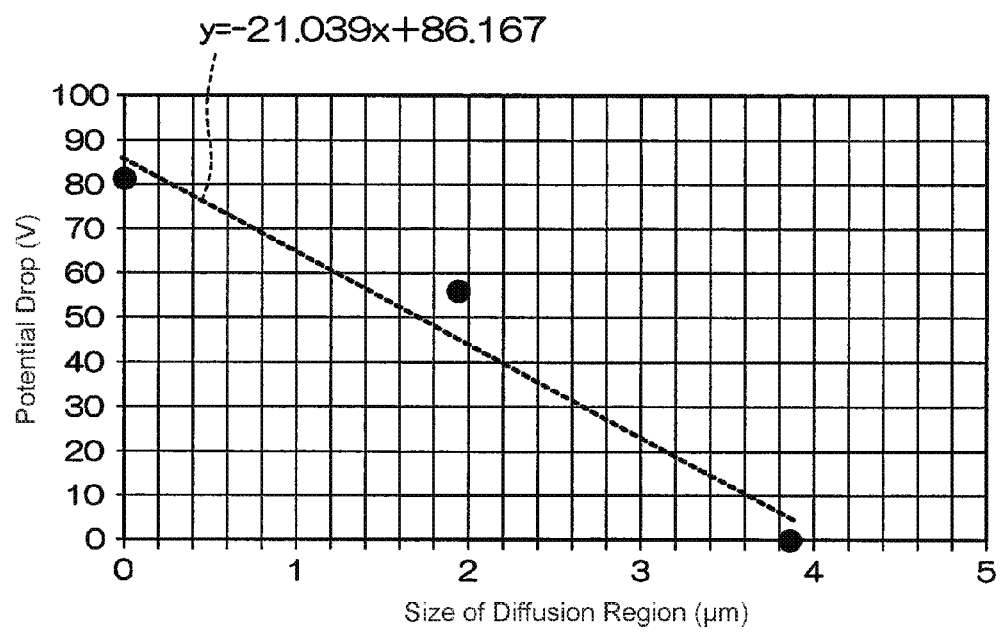
FIG. 20 is a graph that illustrates a relationship between potential drops and the size of a diffusion shape.

It is clear from FIG. 20 that the structure that causes the greatest drop in potential is a structure (a structure that includes a diffusion region 41 like that in the Ref structure) in which an extended diffusion region 36 is not formed. If the potential drop is to be made even larger, it will be necessary to conduct tests into changing the width of the columns, the orientation of the diffusion region, and the like.

<Verification Tests on the Effect of Introducing an Extended Diffusion Region (2)>

Figure 28:
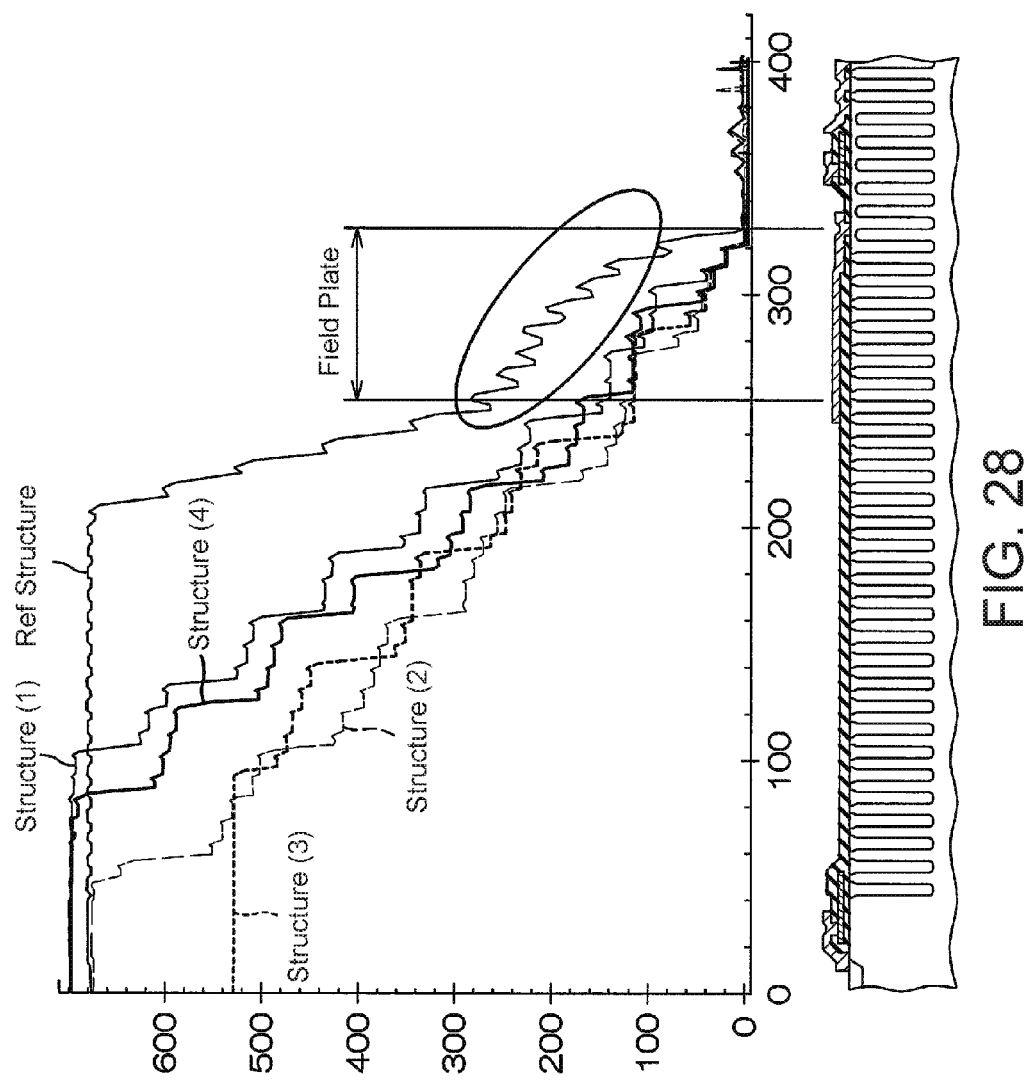
FIG. 28 is a profile of potential drops based on the simulation results illustrated in FIGS. 22 to 26.

Next, simulations were conducted using a variety of patterns that included mainly B-type columns with A-type columns arranged at equally-spaced intervals. FIG. 21 shows a table that shows the various combinations of A-type columns and B-type columns used in the simulations. Similar to FIG. 9, the blank boxes correspond to A-type columns and the boxes with a "B" correspond to B-type columns in the table. Structure (1) in FIG. 21 is the same as structure (4) in FIG. 9. FIGS. 22 to 26 respectively show the results of the simulations for structures (1) to (4) and the Ref structure. FIG. 27 is a table that shows a summary of the simulation results illustrated in FIGS. 22 to 26. FIG. 28 is a profile of potential drops based on the simulation results illustrated in FIGS. 22 to 26.

From the data shown in FIGS. 22 to 27, one commonality was found between the Ref structure and structures (1) to (4). This commonality was that the column at the end of the depletion layer was always an A-type column. This indicates that as the depletion layer spread outward in the semiconductor device 1, the potential dropped, and that ultimately the electric field became concentrated in locations where A-type columns were formed and the depletion layer was prevented from spreading further. In addition, it can be seen from FIG. 19 that a potential drop of 81V occurred in A-type columns while a potential drop of 10V occurred in B-type columns.

As shown in FIG. 28, however, while a potential drop of approximately 80V occurred in A-type columns in structures (1) to (4), a potential drop of only approximately 20V occurred for each column directly below the field plate 9, despite the fact that all of the columns in that region were A-type columns. This shows that the field plate 9 helped the depletion layer to expand outward, leading to a decrease in the value of the potential drop (dotted line section in FIG. 28). In other words, it is possible to have a high breakdown voltage by disposing A-type columns, which have a large potential drop value, directly below the field plate 9. Therefore, it can be expected that reducing the electric field near the end of the field plate 9 by disposing A-type columns directly below the field plate 9 is one of the optimal arrangements for decreasing the width of the peripheral area 3.

In addition, it was learned that there were five or less A-type columns between the end of the field plate 9 and the termination of the peripheral area 3 in all of structures (1) to (4). Therefore, it is believed that in these structures the actual potential drop is 81V per column outside the field plate 9 (which adds up to approximately 400V for the five columns) and approximately 300V directly beneath the field plate 9. It is believed that the reason that the breakdown voltage value calculated for structure (3) was relatively low at 532V was that the A-type columns near the end of the field plate 9 were included as part of the field plate 9. This led to the breakdown voltage being calculated as the breakdown voltage of the field plate 9, which was 300V, plus the breakdown voltage of the remaining three A-type columns, which was 240V, which adds up to a total of approximately 540V. In other words, the two columns nearest to the end of the field plate 9 were treated as being directly under the field plate 9.

<Relationship Between Specific Resistance and Breakdown Voltage (2)>

The purpose of the verification tests (1) and (2) on the effect of introducing an extended diffusion region was to find a way to reduce rapid changes in potential by introducing the extended diffusion region and to control decreases in breakdown voltage that were a result of the electric field becoming concentrated. The tests produced a calculated increase in the breakdown voltage of approximately 20V. In addition, since the amount of potential drop for one column on the semiconductor surface was greatly reduced, these tests show promising results for improving the reliability of such a semiconductor device. The above-mentioned simulations were conducted using the Ref structure as a baseline. Thus, the specific resistance of the periphery-side p-type column layers 26 (p-type embedded layers) was determined in accordance with the relationship between specific resistance and breakdown voltage shown in FIG. 8. Changes in charge balance due to the introduction of an extended diffusion region were also evaluated.

Figure 22:
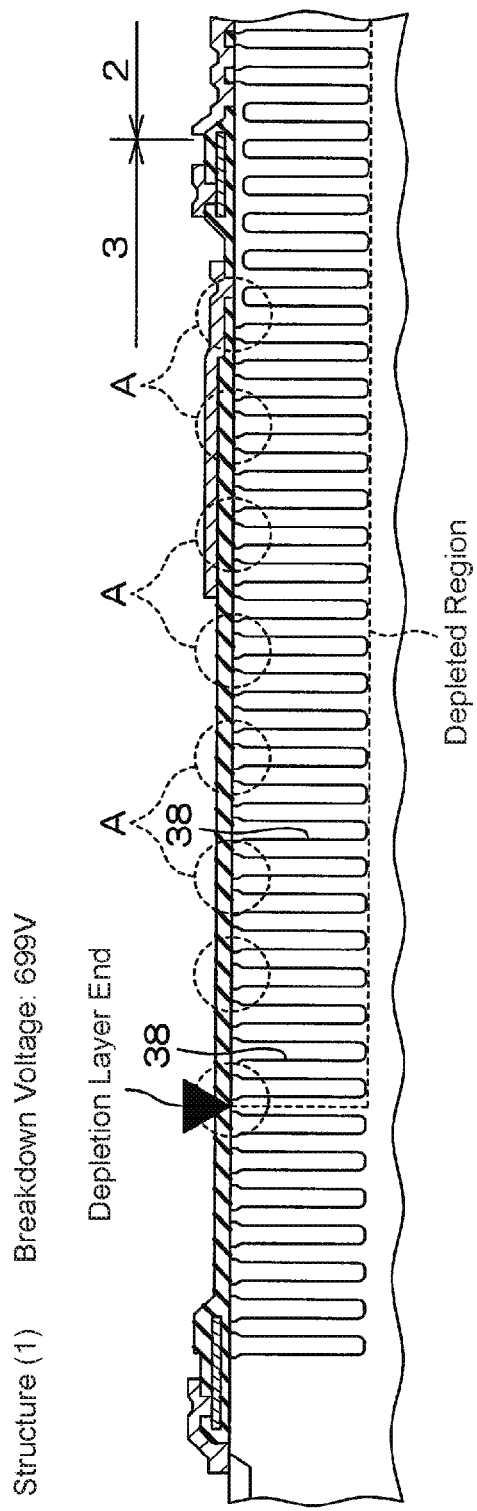
FIG. 22 is used to explain the results of one of the simulations.
Figure 23:
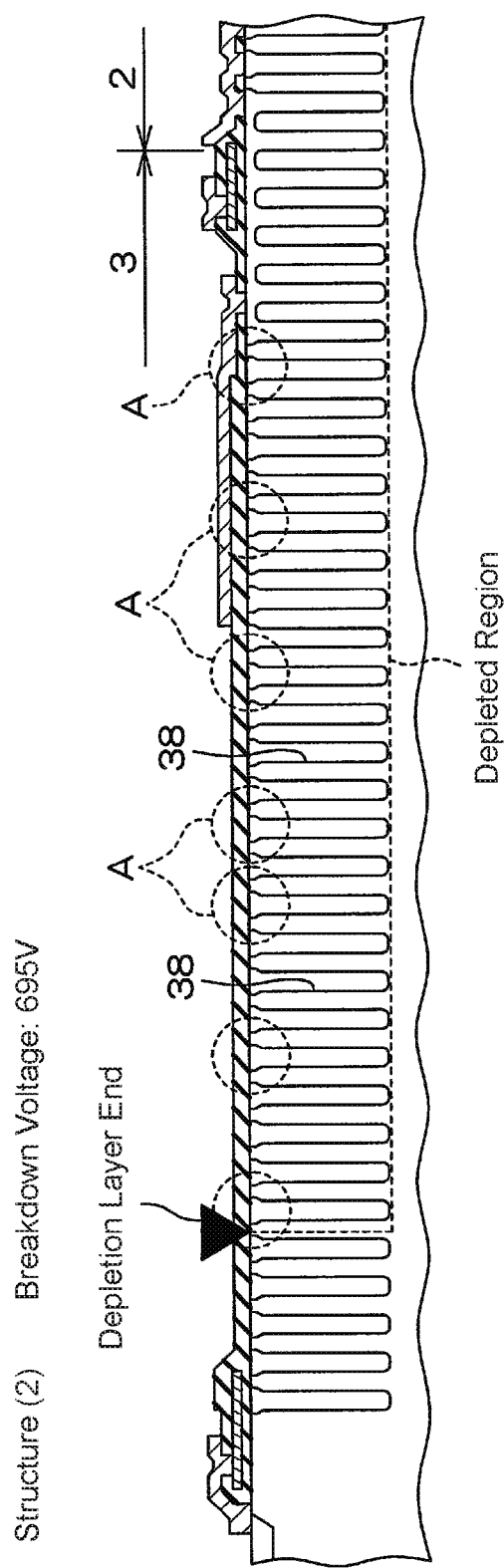
FIG. 23 is used to explain the results of one of the simulations.
Figure 24:
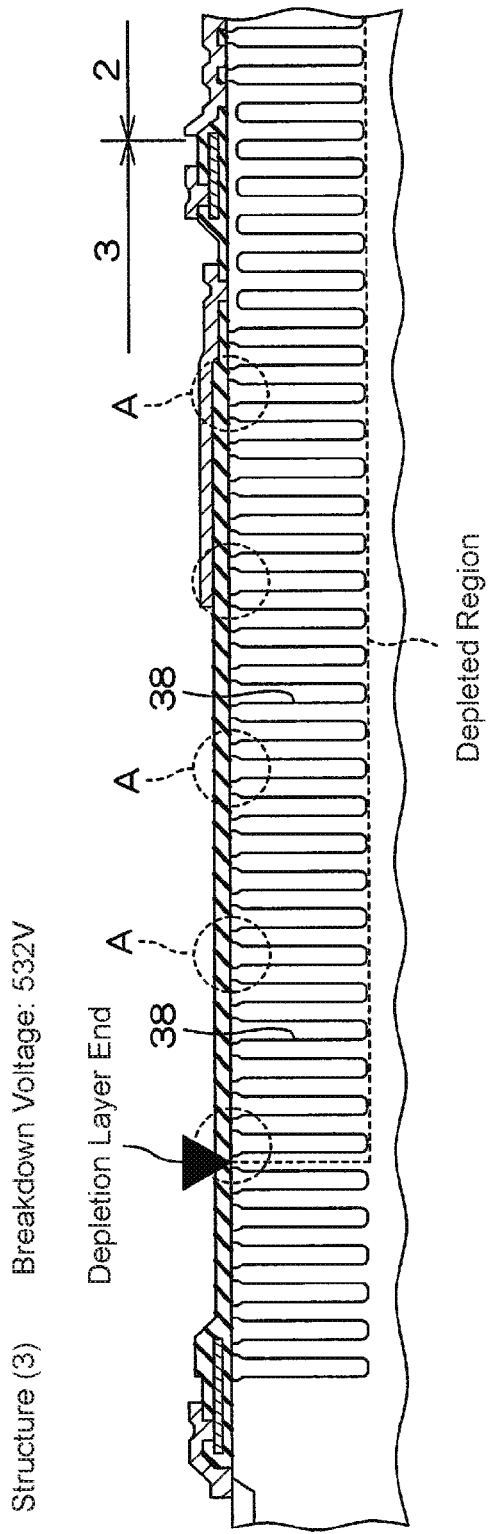
FIG. 24 is used to explain the results of one of the simulations.
Figure 25:
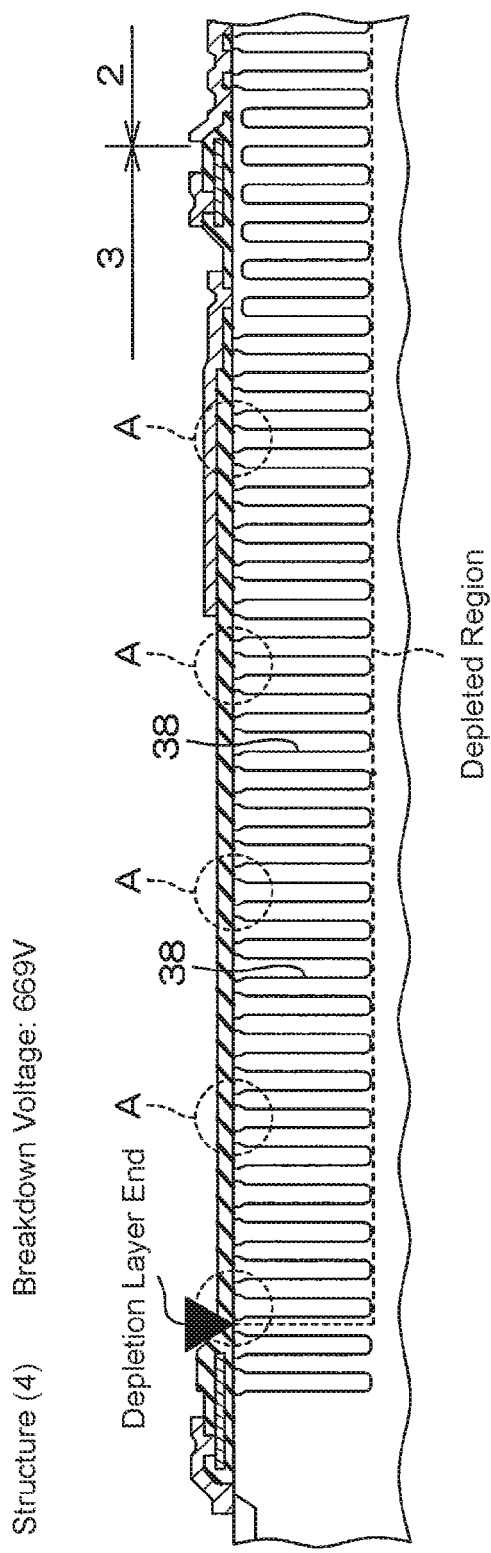
FIG. 25 is used to explain the results of one of the simulations.
Figure 26:
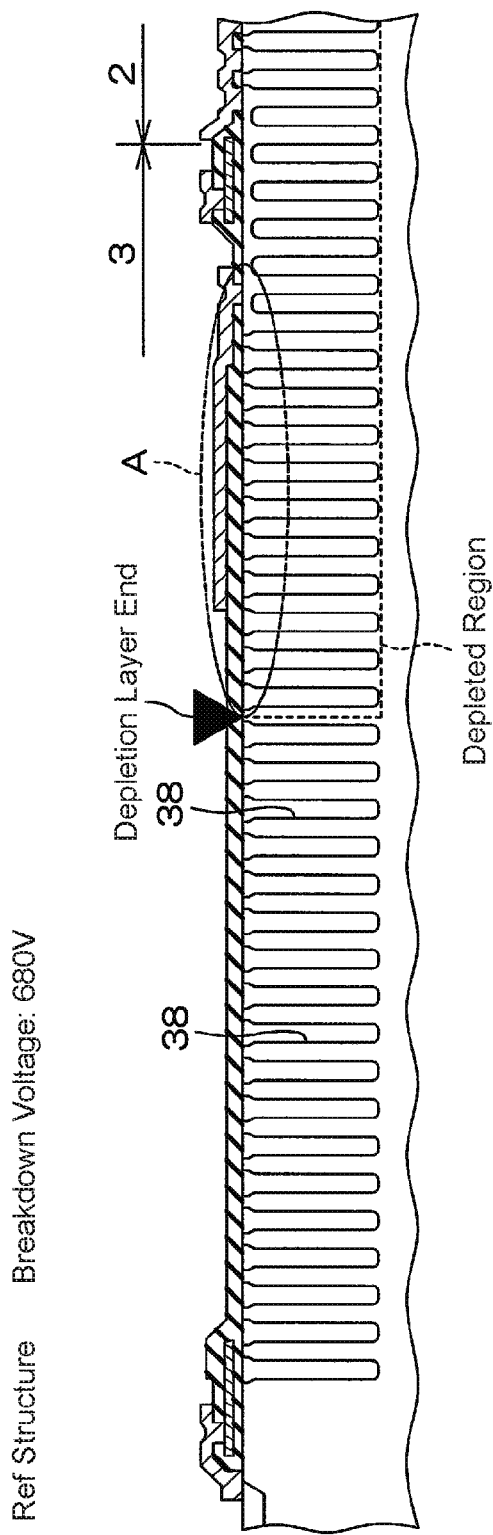
FIG. 26 is used to explain the results of one of the simulations.
Figure 29:
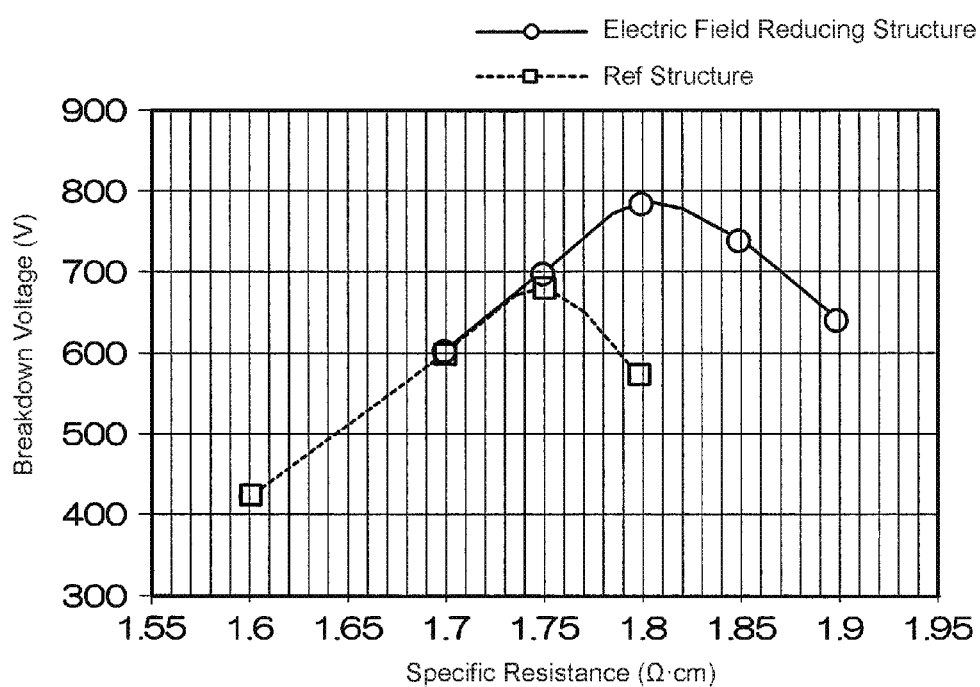
FIG. 29 is a graph that shows a relationship between breakdown voltage and specific resistance for the simulation illustrated in FIG. 22.

FIG. 29 is a graph that shows the relationship between specific resistance and breakdown voltage for the structures used in the simulations shown in FIGS. 22 and 26. FIG. 30 is a table that shows the relationship between specific resistance and breakdown voltage for the structures used in the simulations shown in FIGS. 22 and 26. In FIGS. 29 and 30, "an electric field reduction structure" corresponds to simulation structure (1) in FIG. 22.

From FIGS. 29 and 30, it can be seen that the electric field reduction structure had a higher peak breakdown voltage. It was learned by testing the electric field reduction structure in the manner described above that the breakdown voltage increased by as much as 20V. From the results shown in FIG. 29 and FIG. 30, it can be seen that the breakdown voltage is further increased by adjusting the charge balance.

In the calculations for these simulations, only the impurity concentration in the columns themselves was changed. The impurity concentration in the extended diffusion region was fixed at $8.0 \times 10^{15}$ cm$^{-3}$. The aim in so doing was to verify whether or not introducing the extended diffusion region would have any effect on the columns. The results shown in FIGS. 29 and 30 show the existence of such an effect.

From these results, it was confirmed that there was an increase in the breakdown voltage when the impurity concentration in the columns was low compared to the impurity concentration in the extended diffusion region. In other words, appropriately selecting an impurity concentration for the extended diffusion region eliminates the need for raising the specific resistance of the columns. In addition, the location of the depletion layer and the disposition of the electric field concentration were evaluated for the various impurity concentrations during the simulation. It was thus determined that there was an increase in the breakdown voltage for structures in which the depletion layer extended further outward.

Figure 31:
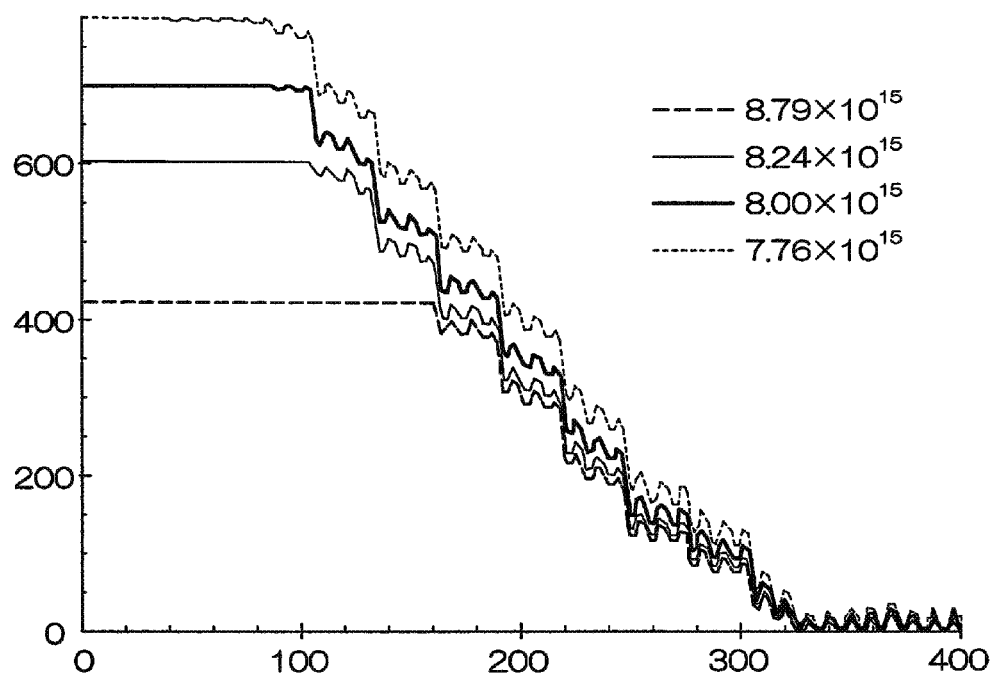
FIG. 31 is a profile of potential drops for various impurity concentrations in the simulation shown in FIG. 22.

FIG. 31 shows a profile of potential drops with respect to various impurity concentrations for the simulation shown in FIG. 22. As shown in FIG. 31, the potential drop due to the introduction of the extended diffusion region was different for each of the impurity concentrations. Thus, it is believed that there was ultimately variance in the breakdown voltage as a result of the different impurity concentrations.

When the impurity concentration is low, it is more difficult for the depletion layer to spread through the columns than for the depletion layer to spread along the semiconductor surface. Thus, it is generally better to first extend the depletion layer on the semiconductor surface. In addition, it was determined that the electric field becomes concentrated across all of the columns since a concentration gradient forms between the semiconductor surface and the columns. In other words, this result aligns with the previously mentioned statement in which it was determined that it is preferable that an increase in the breakdown voltage be used to support the electric field intensity throughout the entire peripheral area 3.

<Verification Tests on the Effect of Introducing an Extended Diffusion Region (3)>

As a result of the previously mentioned test results, it was determined that the optimal electric field arrangement was to intentionally cause the electric field to become concentrated in a region that included the area directly below an FP (field plate) and the three columns closest to the end of the FP. This would lead to a drop in potential, which would in turn contribute to an increase in the breakdown voltage. Hereafter, the calculation results for the optimal configuration will be given, and results regarding the physical distribution and changes in potential of the structure will also be given.

Figure 32:
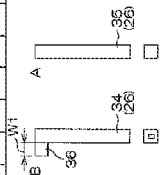
FIG. 32 is a table that shows the conditions of various simulations (various combinations of periphery-side columns).
Figure 33:
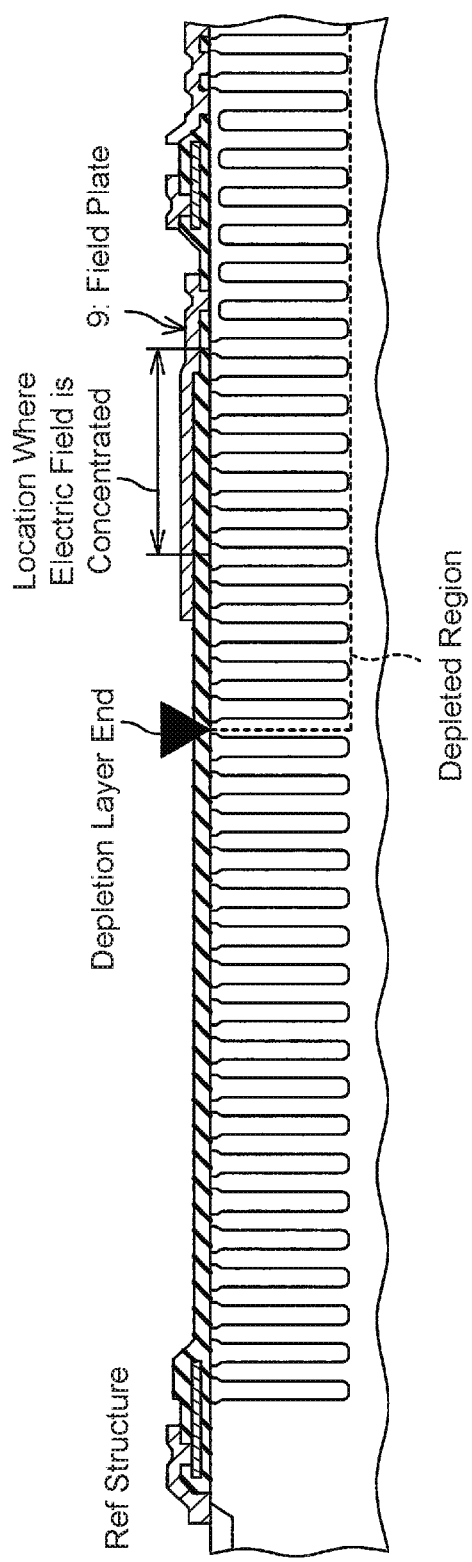
FIG. 33 is used to explain the results of one of the simulations.
Figure 34:
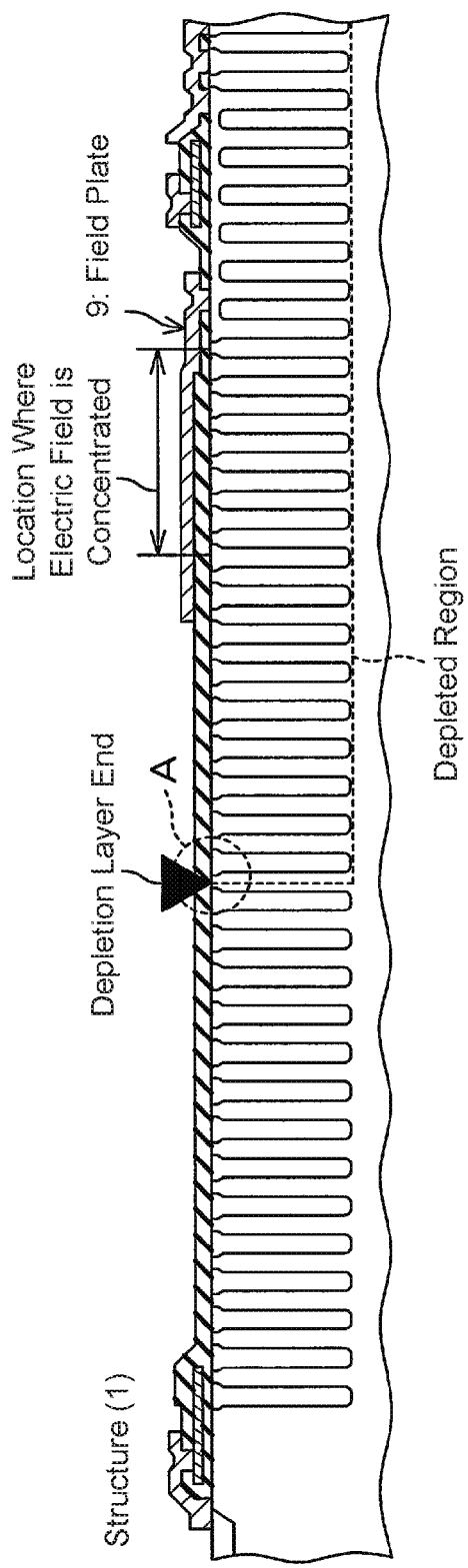
FIG. 34 is used to explain the results of one of the simulations.
Figure 35:
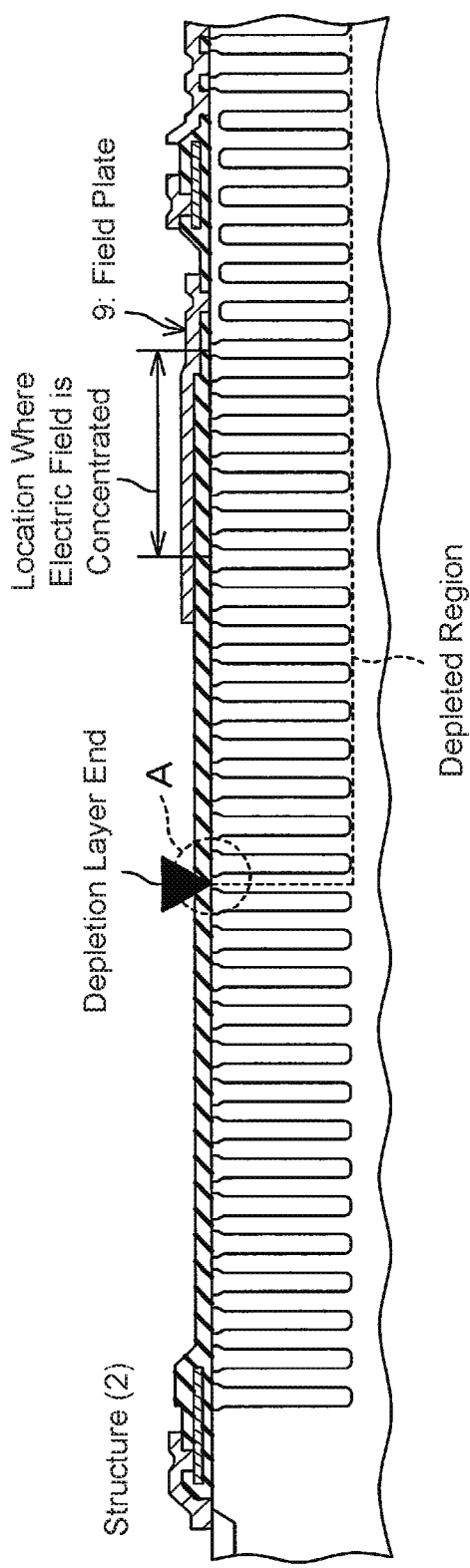
FIG. 35 is used to explain the results of one of the simulations.
Figure 36:
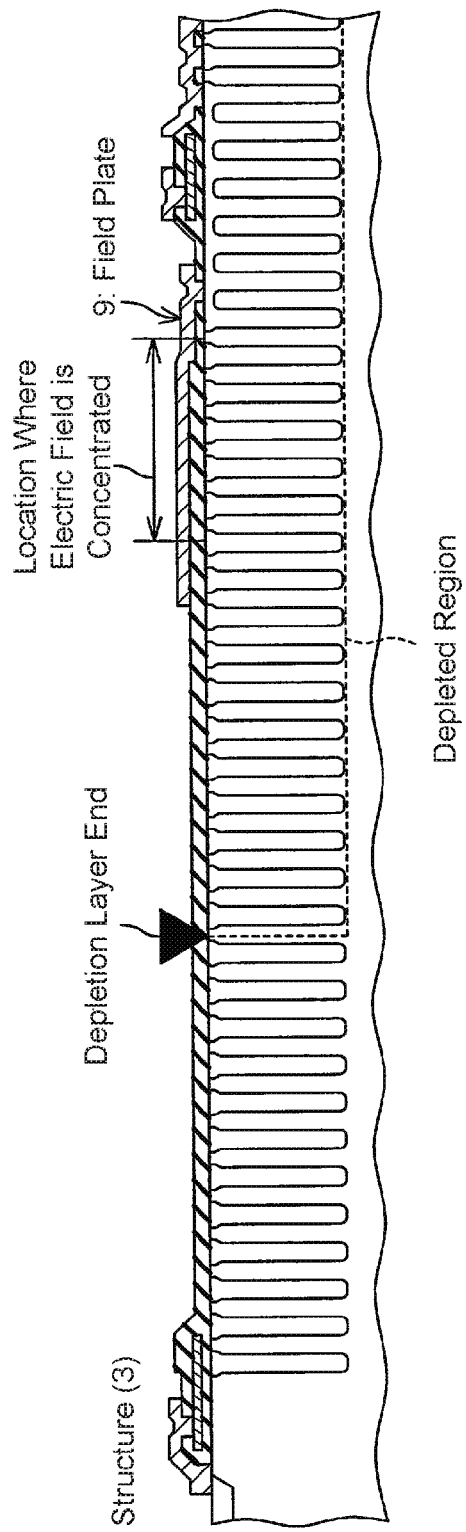
FIG. 36 is used to explain the results of one of the simulations.
Figure 37:
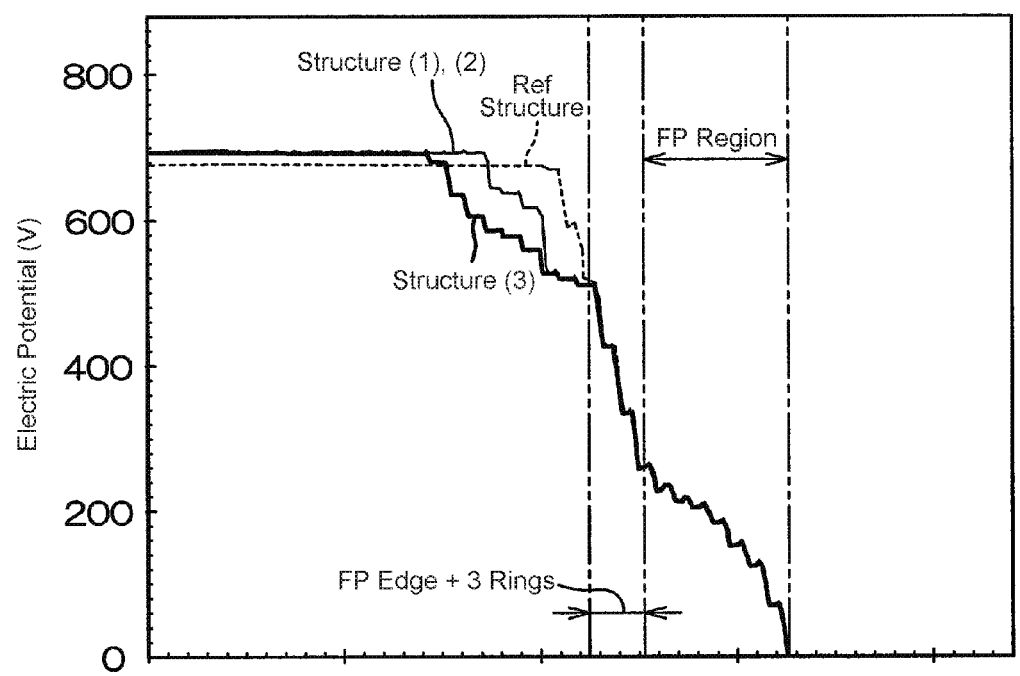
FIG. 37 is a profile of potential drops based on the simulation results illustrated in FIGS. 33 to 36.
Figure 38:
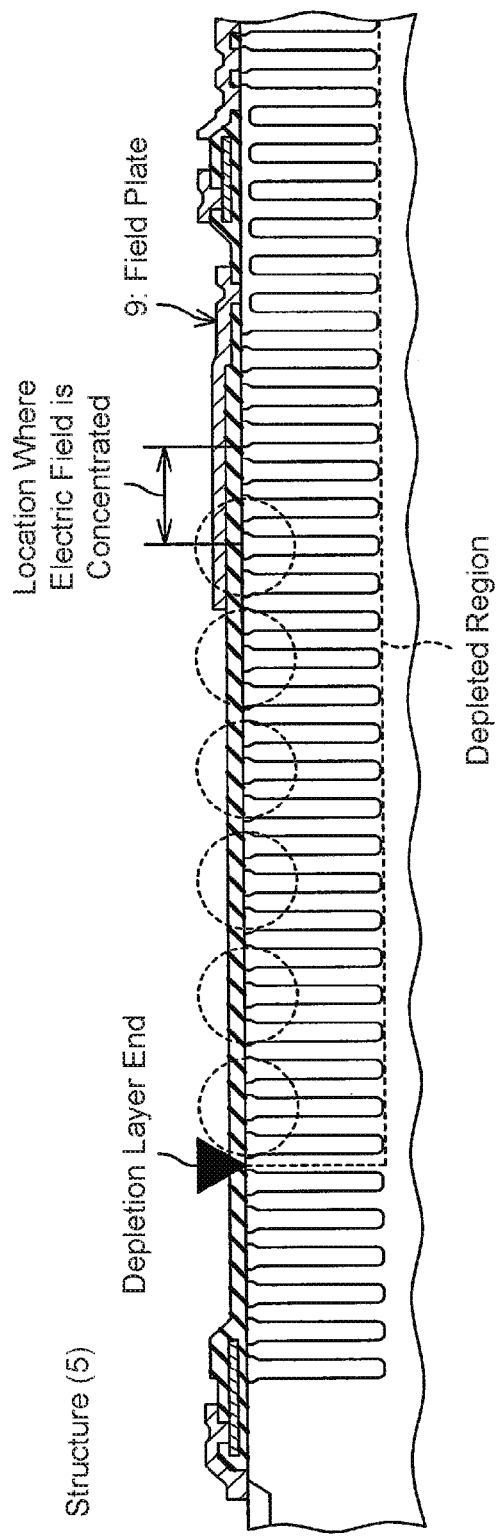
FIG. 38 is used to explain the results of one of the simulations.

FIG. 32 shows a table that shows the various combinations of A-type columns and B-type columns used in the simulations. Similar to FIG. 9, the blank boxes correspond to A-type columns, the boxes with a "B" correspond to B-type columns, and the columns with a "C" correspond to C-type columns. In FIG. 32, impurity concentrations were used in the columns of structures (5) to (7) such that the peak breakdown voltage was achieved in accordance the results shown in FIGS. 29 and 30. This was done in a manner similar to that used for structures (1) to (3) in FIG. 21. FIGS. 33 to 36 respectively show the results of the simulations for structures (1) to (3) and the Ref structure. FIG. 37 is a profile of potential drops based on the simulation results illustrated in FIGS. 33 to 36.

As shown in FIGS. 33 to 36, it was determined that it is possible to concentrate the electric field in a region that includes the area directly beneath the FP and the three columns closest to the end of the FP. It was also determined that the end of the depletion layer can be expanded further outwards. However, the breakdown voltage did not change, and was substantially identical for both the Ref structure and the structure in which the depletion layer was expanded. In addition, as shown in FIG. 37, it became clear that it was not possible in structures (1) to (3) to exceed the maximum possible breakdown voltage of 780V (structure (1) in FIG. 21+an adjusted specific resistance) obtained in the above-mentioned verification tests.

With this in the mind, the characteristics of such a structure, in which the maximum breakdown voltage of 780V was obtained, were investigated. The impurity concentrations in the columns of similar structures were set to specified values, and tests were conducted as to whether or not the breakdown voltage would increase.

Figure 39:
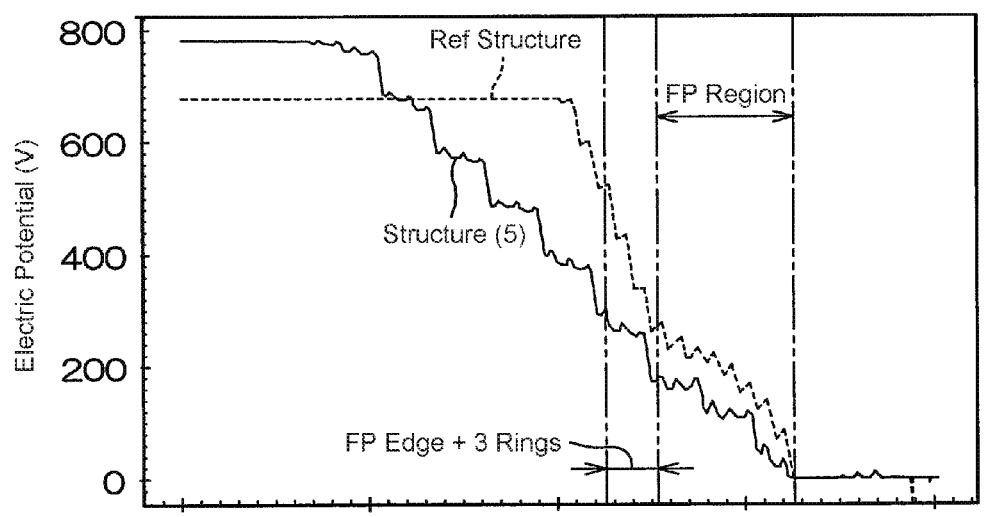
FIG. 39 is a profile of potential drops based on the simulation results illustrated in FIGS. 33 and 38.
Figure 40:
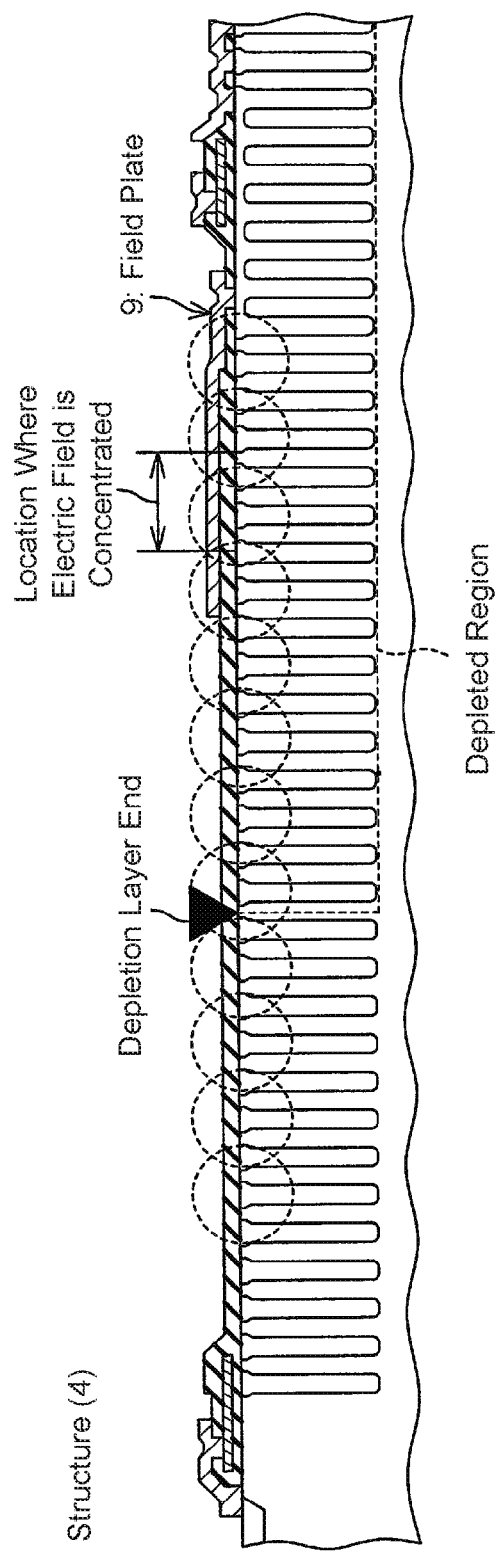
FIG. 40 is used to explain the results of one of the simulations.
Figure 41:
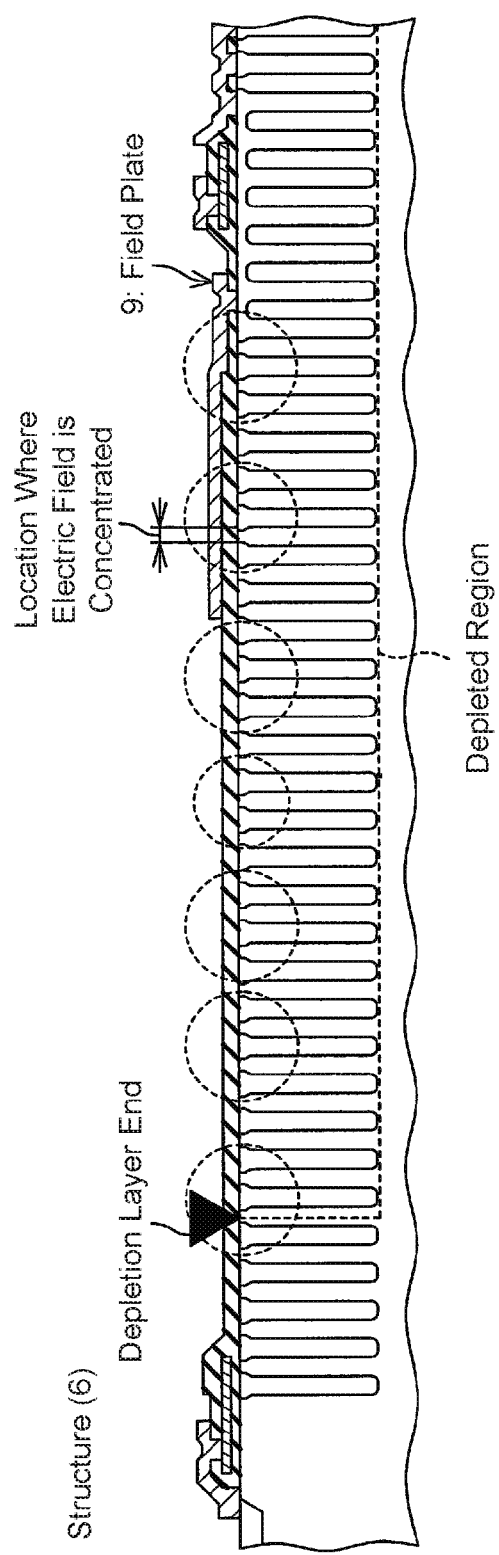
FIG. 41 is used to explain the results of one of the simulations.
Figure 42:
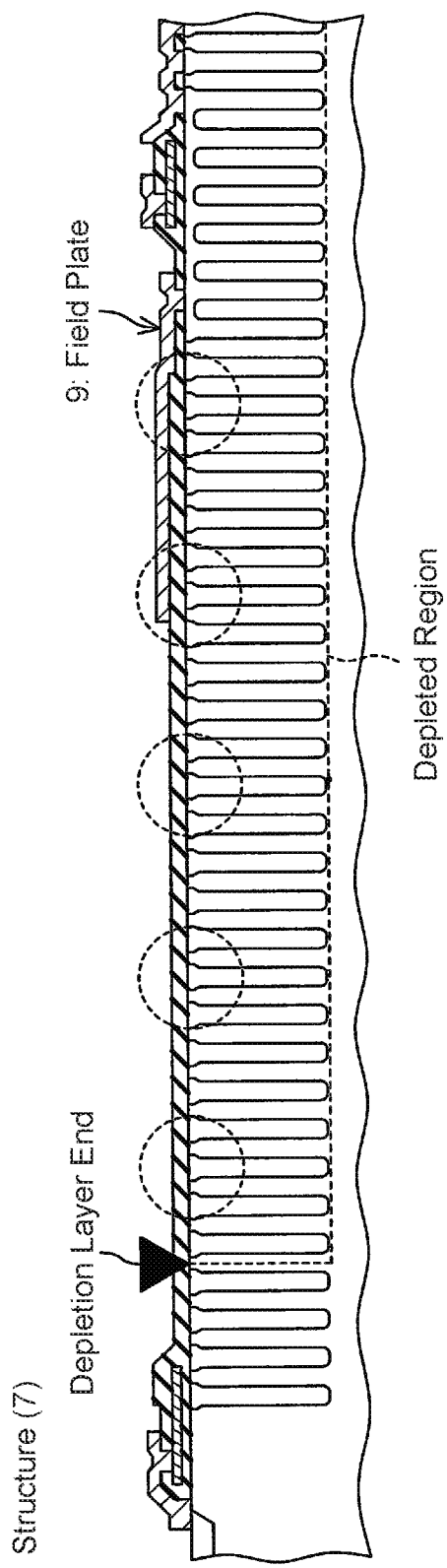
FIG. 42 is used to explain the results of one of the simulations.
Figure 43:
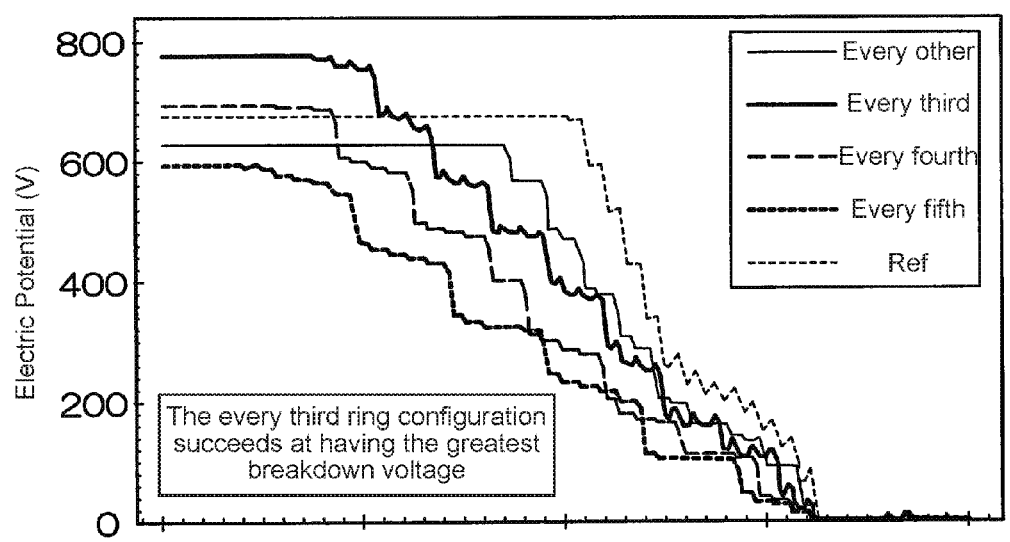
FIG. 43 is a profile of potential drops based on the simulation results illustrated in FIGS. 33, 38, and 40 to 42.
Figure 44:
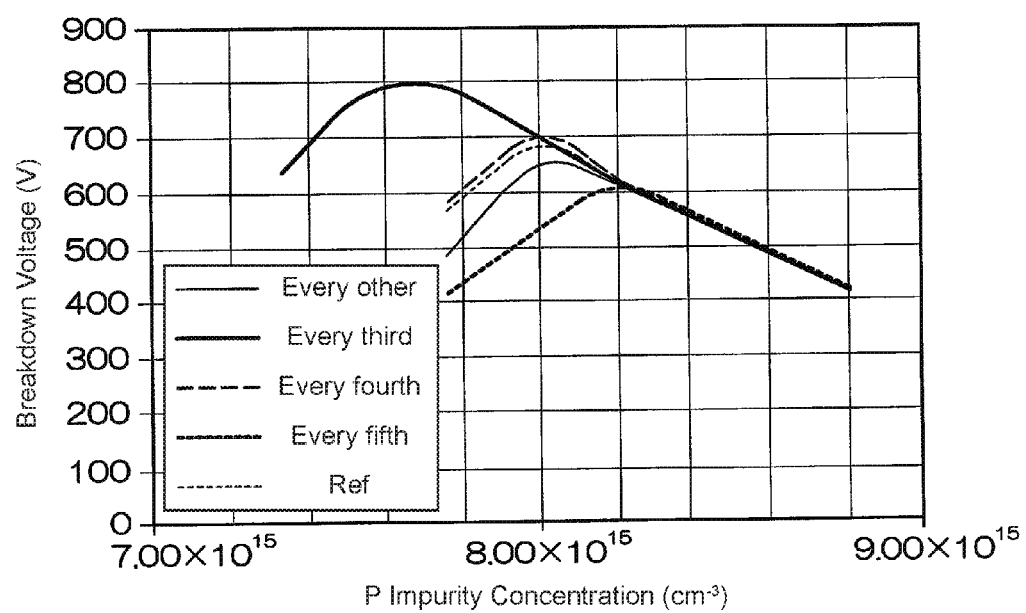
FIG. 44 is a graph that shows a relationship between breakdown voltage and impurity concentration for the various simulations.

FIGS. 38, 40, 41, and 42 respectively show the simulation results for structures (5), (4), (6), and (7). FIG. 37 is a profile of potential drops based on the simulation results illustrated in FIGS. 33 to 36. FIG. 39 is a profile of potential drops based on the simulation results illustrated in FIGS. 33 and 38. FIG. 43 is a profile of potential drops based on the simulation results illustrated in FIGS. 33, 38, and 40 to 42. FIG. 44 is a graph that shows the relationship between breakdown voltage and impurity concentration in the various simulations.

As shown in FIGS. 43 and 44, tests were conducted in which the p-type impurity concentration in the columns was set to specified values in various structures in which A-type columns were disposed at equal intervals. In the respective structures, A-type columns were disposed every third column (structure 5), every other column, every fourth column, and every fifth column. The highest breakdown voltage results were obtained in the structure in which A-type columns were disposed every third column. Particularly in FIG. 44, a noticeable improvement in breakdown voltage is evident for similar structures (4), (6), and (7).

In addition, when the electric field distribution of the structures shown in FIGS. 38 and 40 to 42 was investigated, the electric field was concentrated in two columns within the FP region in structure (5), in which A-type columns were disposed every third column. In the other similar structures (4), (6), and (7), the electric field was concentrated in one column or five columns. As a result, it is believed that it is possible that the concentration of the electric field directly beneath the FP is very important. In other words, it is expected that the electric field concentration directly under the FP is optimal in a structure in which A-type columns are disposed every third column. There is no clear difference in the spread of the depletion layer between the every third structure (5) and the other similar structures (4), (6), and (7).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor layer of a first conductivity type, having a peripheral area and a cell area inside of the peripheral area;
   a region of a second conductivity type in the semiconductor layer in the cell area; and
   a plurality of guard rings of the second conductivity type in the semiconductor layer in the peripheral area, each having a substantially same depth as the region of the second conductivity type in the cell area,
   wherein the plurality of guard rings include at least one first ring that has a diffusion region in a depth profile in the semiconductor layer that is wider at a top thereof,
   wherein the region of the second conductivity type in the cell area includes a cell-side column in the depth profile in the semiconductor layer that forms a superjunction structure, and
   wherein the guard rings are respectively formed of a periphery-side column in the depth profile in the semiconductor layer that has a substantially same depth as the cell-side column.

2. The semiconductor device according to claim 1, wherein the cell-side column and the periphery-side columns respectively include:
   a trench that defines an outline of said column; and
   an embedded layer of the second conductivity type inside the trench.

3. The semiconductor device according to claim 2, wherein the embedded layer of the second conductivity type includes:
   an outer layer formed along an inner surface of the trench; and
   an inner layer that is embedded inside the outer layer and that has a specific resistance that is lower than a specific resistance of the outer layer.

4. The semiconductor device according to claim 1, wherein a width of the diffusion region at the top of the first ring is 0.2 to 0.6 times a distance between adjacent guard rings.

5. The semiconductor device according to claim 1, wherein an impurity concentration in the diffusion region of the first ring that is wider at the top thereof is higher than an impurity concentration in a region directly beneath the diffusion region.

6. The semiconductor device according to claim 1, further comprising an equipotential ring outside the plurality of guard rings that is electrically connected to the semiconductor layer.

7. The semiconductor device according to claim 1, wherein the semiconductor layer is an n-type semiconductor layer and the guard rings are p-type guard rings.

8. The semiconductor device according to claim 1, wherein the semiconductor layer is made of silicon.

9. A semiconductor device, comprising:
a semiconductor layer of a first conductivity type, having a peripheral area and a cell area inside of the peripheral area;
a region of a second conductivity type in the semiconductor layer in the cell area; and
a plurality of guard rings of the second conductivity type in the semiconductor layer in the peripheral area, each having a substantially same depth as the region of the second conductivity type in the cell area,
wherein the plurality of guard rings include at least one first ring that has a diffusion region in a depth profile in the semiconductor layer that is wider at a top thereof, and
wherein the plurality of guard rings have a second ring between adjacent first rings, the second ring having a uniform width in the depth profile and not having said diffusion region that is wider at the top thereof.

10. The semiconductor device according to claim 9, wherein the plurality of guard rings have the second ring as an outermost guard ring.

11. A semiconductor device, comprising:
a semiconductor layer of a first conductivity type, having a peripheral area and a cell area inside of the peripheral area;
a region of a second conductivity type in the semiconductor layer in the cell area; and
a plurality of guard rings of the second conductivity type in the semiconductor layer in the peripheral area, each having a substantially same depth as the region of the second conductivity type in the cell area,
wherein the plurality of guard rings include at least one first ring that has a diffusion region in a depth profile in the semiconductor layer that is wider at a top thereof, and
wherein there are at least 25 guard rings in the plurality of guard rings.

12. The semiconductor device according to claim 11, wherein the plurality of guard rings have a second ring in place of every third or fourth first ring as counted from a center of the guard rings, the second ring having a uniform width in the depth profile and not having said diffusion region that is wider at the top thereof.

13. The semiconductor device according to claim 11, wherein a specific resistance of the guard rings is $1.75\Omega\cdot\text{cm}$ to $1.85\Omega\cdot\text{cm}$.

14. The semiconductor device according to claim 11, wherein an impurity concentration of the guard rings is $7.4\times10^{15}\text{cm}^{-3}$ to $8.2\times10^{15}\text{cm}^{-3}$.

15. A semiconductor device, comprising:
a semiconductor layer of a first conductivity type, having a peripheral area and a cell area inside of the peripheral area;
a region of a second conductivity type in the semiconductor layer in the cell area;
a plurality of guard rings of the second conductivity type in the semiconductor layer in the peripheral area, each having a substantially same depth as the region of the second conductivity type in the cell area;
an insulating film formed on the semiconductor layer; and
a field plate that faces the plurality of guard rings through the insulating film,
wherein the plurality of guard rings include at least one first ring that has a diffusion region in a depth profile in the semiconductor layer that is wider at a top thereof, and
wherein the plurality of guard rings include a second ring directly under the field plate, the second ring having a uniform width in the depth profile and not having said diffusion region that is wider at the top thereof.

16. The semiconductor device according to claim 15, wherein each of the guard rings that are directly under the field plate the second ring.

17. The semiconductor device according to claim 15, wherein the plurality of guard rings include at least one second ring among the five guard rings located immediately outside the field plate.

* * * * *